(12) United States Patent
Yokoi et al.

(10) Patent No.: US 10,069,439 B2
(45) Date of Patent: Sep. 4, 2018

(54) POWER CONVERSION SYSTEM, POWER MODULE, AND SEMICONDUCTOR DEVICE WITH DIODE COUPLING

(71) Applicant: Renesas Electronics Corporation, Tokyo (JP)

(72) Inventors: Yoshihiko Yokoi, Tokyo (JP); Yusuke Ojima, Tokyo (JP); Koichi Yamazaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/376,374

(22) Filed: Dec. 12, 2016

(65) Prior Publication Data

US 2017/0179849 A1    Jun. 22, 2017

(30) Foreign Application Priority Data

Dec. 22, 2015  (JP) .................................. 2015-249302
Sep. 21, 2016  (JP) .................................. 2016-184055

(51) Int. Cl.
| | |
|---|---|
| *H02M 7/00* | (2006.01) |
| *H02M 7/5387* | (2007.01) |
| *H03K 17/082* | (2006.01) |
| *H02M 7/538* | (2007.01) |
| *H02M 7/53* | (2006.01) |

(52) U.S. Cl.
CPC ......... *H02M 7/5387* (2013.01); *H02M 7/003* (2013.01); *H02M 7/53* (2013.01); *H02M 7/538* (2013.01); *H03K 17/0828* (2013.01); *H01L 2224/48247* (2013.01)

(58) Field of Classification Search
CPC ............................... H02M 7/539; H02M 7/53
See application file for complete search history.

(56) References Cited

U.S. PATENT DOCUMENTS

| | | | |
|---|---|---|---|
| 6,288,597 B1 | 9/2001 | Hasegawa et al. | |
| 2005/0035747 A1* | 2/2005 | Mullett | H02M 3/1582 323/285 |
| 2014/0210445 A1* | 7/2014 | Hasegawa | H04W 48/04 323/284 |

FOREIGN PATENT DOCUMENTS

| | | |
|---|---|---|
| JP | 2000-124781 A | 4/2000 |
| JP | 2006-114575 A | 4/2006 |

* cited by examiner

*Primary Examiner* — Jue Zhang
*Assistant Examiner* — Trinh Q Dang
(74) *Attorney, Agent, or Firm* — McGinn IP Law Group, PLLC

(57) ABSTRACT

A power conversion system has a first coupling circuit including a wire between a controller and a high-side circuit and a second coupling circuit including a wire between the controller and a low-side circuit. The first coupling circuit has a diode having an anode coupled to a wire from the controller and a cathode coupled to a wire from the high-side circuit.

18 Claims, 20 Drawing Sheets

OPERATION OF TEMPERATURE DETECTION CIRCUIT (TChu)

TOHu-VSu →

TIHu →
LOu →

DISTORTION DUE TO SWITCHING NOISE

OPERATION OF TEMPERATURE DETECTION CIRCUIT (TChu)

TILu →
TOLu →

LOu →

DISTORTION DUE TO SWITCHING NOISE

POWER CONVERSION SYSTEM, POWER MODULE, AND SEMICONDUCTOR DEVICE WITH DIODE COUPLING

CROSS-REFERENCE TO RELATED APPLICATION

The present application claims priority from Japanese Patent Applications No. 2015-249302 filed on Dec. 22, 2015 and No. 2016-184055 filed on Sep. 21, 2016, the contents of which are hereby incorporated by reference into this application.

TECHNICAL FIELD OF THE INVENTION

The present invention relates to a power conversion system, a power module, and a semiconductor device and, for example, relates to communication techniques for a high-side circuit in an inverter or the like.

BACKGROUND OF THE INVENTION

Japanese Patent Application Laid-Open Publication No. 2006-114575 discloses a scheme in which diodes are provided at two different locations in a power module and a gradient of temperature is detected at each of these two locations based on temperature characteristics of each diode to estimate the life of a power semiconductor element. Japanese Patent Application Laid-Open Publication No. 2000-124781 discloses a scheme in which an internal gate resistor is connected between a gate electrode of an IGBT chip and a gate terminal of an IGBT module including the chip to detect the temperature of the IGBT module by using the temperature characteristics of the internal gate resistor.

SUMMARY OF THE INVENTION

For example, in an inverter which converts direct-current voltage to alternating-current voltage, power is supplied from a connection terminal between a high-side transistor and a low-side transistor to a load. A high-side circuit including the high-side transistor operates using the voltage of the connection terminal as a reference, and the voltage of the connection terminal fluctuates in response to ON/OFF of the high-side transistor and the low-side transistor. Thus, for example, communication between a controller which operates using a fixed voltage as a reference and the high-side circuit which operates using the fluctuating voltage as a reference is normally performed via an insulating element such as a photocoupler or a digital isolator. However, since these isolating elements are expensive, a cost increase may be caused.

The embodiment to be described later is achieved in view of these matters, and other objects and novel features will be apparent from the description of the present specification and the accompanying drawings.

A power conversion system according to an embodiment includes: a controller communicating with a high-side circuit and a low-side circuit; a first coupling circuit including a wire between the controller and the high-side circuit; and a second coupling circuit including a wire between the controller and the low-side circuit. The high-side circuit includes: a high-side switch coupled between a first power supply terminal and a load drive terminal, the high-side switch supplying power to a load via the load drive terminal; and a high-side driver driving the high-side switch. The low-side circuit includes: a low-side switch coupled between a reference power supply terminal and the load drive terminal, the low-side switch supplying power to the load via the load drive terminal; and a low-side driver driving the low-side switch. The first coupling circuit includes a diode having an anode coupled to the wire from the controller and a cathode coupled to the wire from the high-side circuit.

According to the above-mentioned embodiment, a cost reduction can be achieved in a power conversion system.

BRIEF DESCRIPTIONS OF THE DRAWINGS

DESCRIPTIONS OF THE PREFERRED EMBODIMENTS

Figure 1:
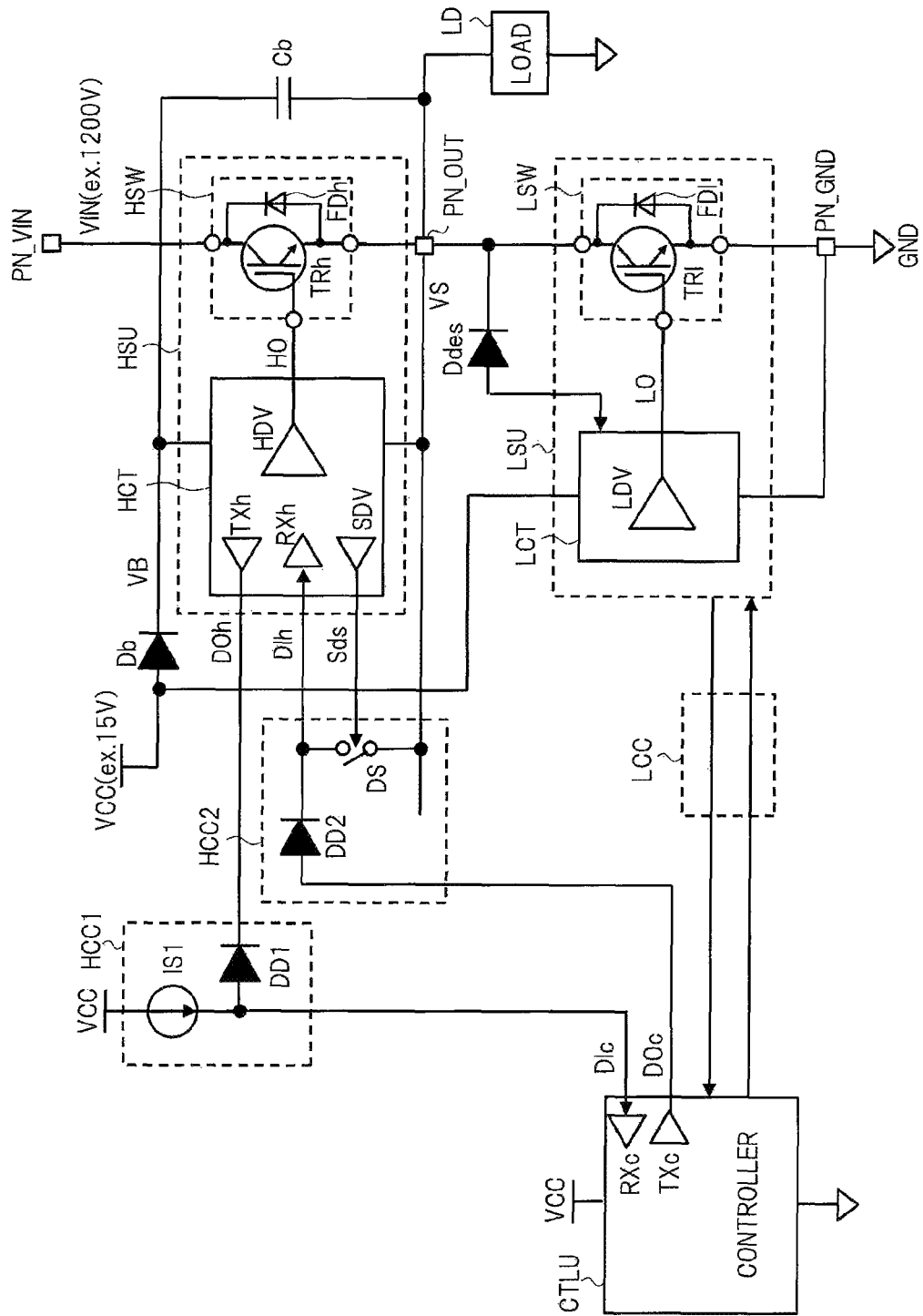
FIG. 1 is a circuit diagram illustrating a schematic configuration example of a main part in a power conversion system according to a first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, while a MOSFET (Metal Oxide Semiconductor Field Effect Transistor) (hereinafter abbreviated as a MOS transistor) is used as an example of a MOSFET (Metal Insulator Semiconductor Field Effect Transistor) in the embodiments, this does not mean that a non-oxide film is excluded as a gate insulating film.

Hereinafter, embodiments of the present invention will be described in detail with reference to the accompanying drawings. Note that components having the same function are denoted by the same reference characters throughout the drawings for describing the embodiments, and the repetitive description thereof is omitted.

First Embodiment

<<Schematic Configuration of Power Conversion System>>

FIG. 1 is a circuit diagram illustrating a schematic configuration example of a main part in a power conversion system according to a first embodiment of the present invention. The power conversion system illustrated in FIG. 1 has a controller CTLU, a high-side circuit HSU, a low-side circuit LSU, coupling circuits HCC1, HCC2, and LCC. The coupling circuits HCC1 and HCC2 each include a wire between the controller CTLU and the high-side circuit HSU, and the coupling circuit LCC includes a wire between the controller CTLU and the low-side circuit LSU.

The high-side circuit HSU includes a high-side switch HSW and a high-side control circuit HCT. The high-side switch HSW is coupled between an input power supply terminal PN_VIN to which an input power supply voltage VIN is supplied using a reference power supply voltage GND as a reference and a load drive terminal PN_OUT, and supplies power to a load LD via the load drive terminal PN_OUT.

Specifically, the high-side switch HSW includes a high-side transistor TRh and a freewheeling diode FDh connected in parallel to the high-side transistor TRh. The high-side transistor TRh is an IGBT (Insulated Gate Bipolar Transistor) or the like, although not particularly limited thereto. The high-side control circuit HCT includes a high-side driver HDV which drives the high-side switch HSW (particularly, the high-side transistor TRh) to an ON state or an OFF state via a high-side switch signal HO, and performs control, protection, and the like of the high-side switch HSW via the high-side driver HDV.

The low-side circuit LSU includes a low-side switch LSW and a low-side control circuit LCT. The low-side switch LSW is coupled between a reference power supply terminal PN_GND to which the reference power supply voltage GND is supplied, and the load drive terminal PN_OUT, and supplies power to the load LD via the load drive terminal PN_OUT. Specifically, the low-side switch LSW includes a low-side transistor TRl and a freewheeling diode FDl connected in parallel to the low-side transistor TRl. The low-side transistor TRl is an IGBT or the like, although not particularly limited thereto.

The low-side control circuit LCT includes a low-side driver LDV which drives the low-side switch LSW (particularly, the low-side transistor TRl) to an ON state or an OFF state via a low-side switch signal LO, and performs control, protection, and the like of the low-side switch LSW via the low-side driver LDV. Here, as illustrated in FIG. 1, in some cases, a diode Ddes may be provided between the load drive terminal PN_OUT and the low-side control circuit LCT. The low-side control circuit LCT monitors an emitter-collector voltage of the low-side transistor TRl via the diode Ddes and based on the monitoring result, performs turnoff or the like of the low-side switch LSW when detecting, for example, a short circuit in the load LD.

The controller CTLU communicates with the high-side circuit HSU via the coupling circuits HCC1 and HCC2 to control the high-side circuit HSU. In the example of FIG. 1, the coupling circuit HCC1 transmits a signal DOh from a transmitting circuit TXh of the high-side control circuit HCT to a receiving circuit RXc of the controller CTLU. Conversely, the coupling circuit HCC2 transmits a signal DOc from a transmitting circuit TXc of the controller CTLU to a receiving circuit RXh of the high-side control circuit HCT.

Also, the controller CTLU communicates with the low-side circuit LSU via the coupling circuit LCC to control the low-side circuit LSU.

In the configuration as described above, the low-side circuit LSU operates at a power supply voltage VCC (for example, 15 V) using the reference power supply voltage GND as a reference. Also in this example, the controller CTLU also operates at the power supply voltage VCC using the reference power supply voltage GND as a reference. In contrast, the high-side circuit HSU operates at a boot power supply voltage VB using a floating voltage VS coupled to the load drive terminal PN_OUT as a reference. The boot power supply voltage VB is generated by, for example, a bootstrap diode Db and a bootstrap capacitor Cb, which are sequentially connected from the power supply voltage VCC toward the load drive terminal PN_OUT.

For example, in a period [1] in which the high-side switch HSW is in an OFF state and the low-side switch LSW is in an ON state, the floating voltage VS becomes the reference power supply voltage GND, and the bootstrap diode Db becomes forward-biased. As a result, the bootstrap capacitor Cb is charged with the power supply voltage VCC, and the boot power supply voltage VB becomes equal to the power supply voltage VCC. Strictly speaking, a voltage drop in a forward direction of the diode occurs. In the specification, however, such a voltage drop is ignored unless otherwise clearly stated. Furthermore, a voltage drop accompanied by ON resistance of each transistor is also ignored.

Conversely, in a period [2] in which the high-side switch HSW is in an ON state and the low-side switch LSW is in an OFF state, the floating voltage VS becomes the input power supply voltage VIN (for example, 1200 V), the boot power supply voltage VB becomes "VIN+VCC" with a charge voltage of the bootstrap capacitor Cb in the period [1], and the bootstrap diode Db becomes reverse-biased. The high-side circuit HSU operates at the power supply voltage VCC supplied via the bootstrap diode Db in the period [1], and operates at the charge voltage (that is, the power supply voltage VCC) of the bootstrap capacitor Cb in the period [2].

<<Communication Scheme of Comparative Example>>

Figure 15:
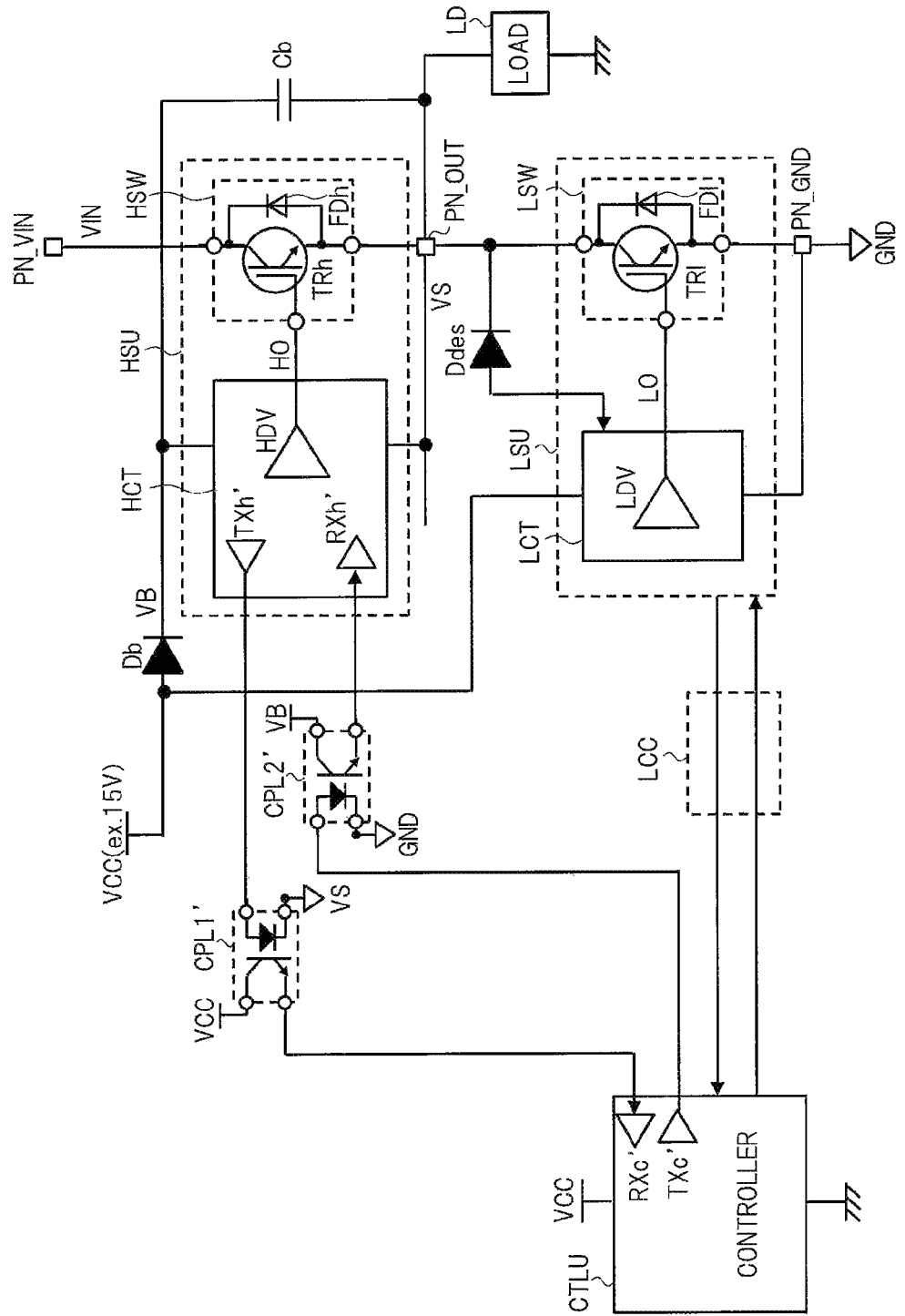
FIG. 15 is a circuit diagram illustrating a schematic configuration example of a main part in a power conversion system according to a comparative example of the present invention.

FIG. 15 is a circuit diagram illustrating a schematic configuration example of a main part in a power conversion system according to a comparative example of the present invention. As described above, while the controller CTLU operates at the power supply voltage VCC using the reference power supply voltage GND as a reference, the high-side circuit HSU operates at "VIN+VCC" using the input power supply voltage VIN as a reference in the period [2]. Therefore, when communication is performed between the controller CTLU and the high-side circuit HSU, for the purpose of signal level matching and prevention of element destruction, insulating elements illustrated in FIG. 15 is required, for example.

A power conversion system illustrated in FIG. 15 includes, as insulating elements, photocouplers CPL1' and CPL2', which each transmit a signal by causing a photodiode to emit light and flowing a current to a phototransistor. The photocoupler CPL1' converts a signal transmitted from a transmitting circuit TXh' of the high-side control circuit HCT and making transitions between the boot power supply voltage VB and the floating voltage VS into a signal making transitions between the power supply voltage VCC and the reference power supply voltage GND, and transmits the signal to a receiving circuit RXc' of the controller CTLU. Conversely, the photocoupler CPL2' converts a signal transmitted from a transmitting circuit TXc' of the controller CTLU and making transitions between the power supply voltage VCC and the reference power supply voltage GND into a signal making transitions between the boot power supply voltage VB and the floating voltage VS, and transmits the signal to a receiving circuit RXh' of the high-side control circuit HCT.

While photocouplers are used as insulating elements in this example, digital isolators which transmit signals by magnetic coupling of two coils may be used, for example. However, since the insulating elements such as photocouplers and digital isolators are generally expensive, a cost increase of the power conversion system may be caused. Moreover, when such expensive components are required, for example, it can be difficult to increase communication paths between the controller CTLU and the high-side circuit HSU.

<<Communication Scheme in First Embodiment>>

Thus, in the power conversion system of the first embodiment, as illustrated in FIG. 1, the coupling circuits HCC1 and HCC2 include diodes DD1 and DD2, respectively, which each have an anode coupled to a wire from the controller CTLU and a cathode coupled to a wire from the high-side circuit HSU. The diodes DD1 and DD2 each are a high withstand voltage diode with a withstand voltage in accordance with, for example, the input power supply voltage VIN (for example, 1200 V).

Furthermore, in the example of FIG. 1, in addition to the diode DD1, the coupling circuit HCC1 includes a current source IS1 coupled between the power supply voltage VCC and the anode of the diode DD1. The current source IS1 flows a subtle current in a forward direction to the diode DD1. Note that the current source IS1 may be replaced by a high-resistance resistor element or the like. Also, in addition to the diode DD2, the coupling circuit HCC2 includes a pulldown switch DS coupled between the cathode of the diode DD2 and the load drive terminal PN_OUT. ON/OFF of the pulldown switch DS is controlled by, for example, a switch signal Sds from a driver SDV of the high-side control circuit HCT.

Figure 2:
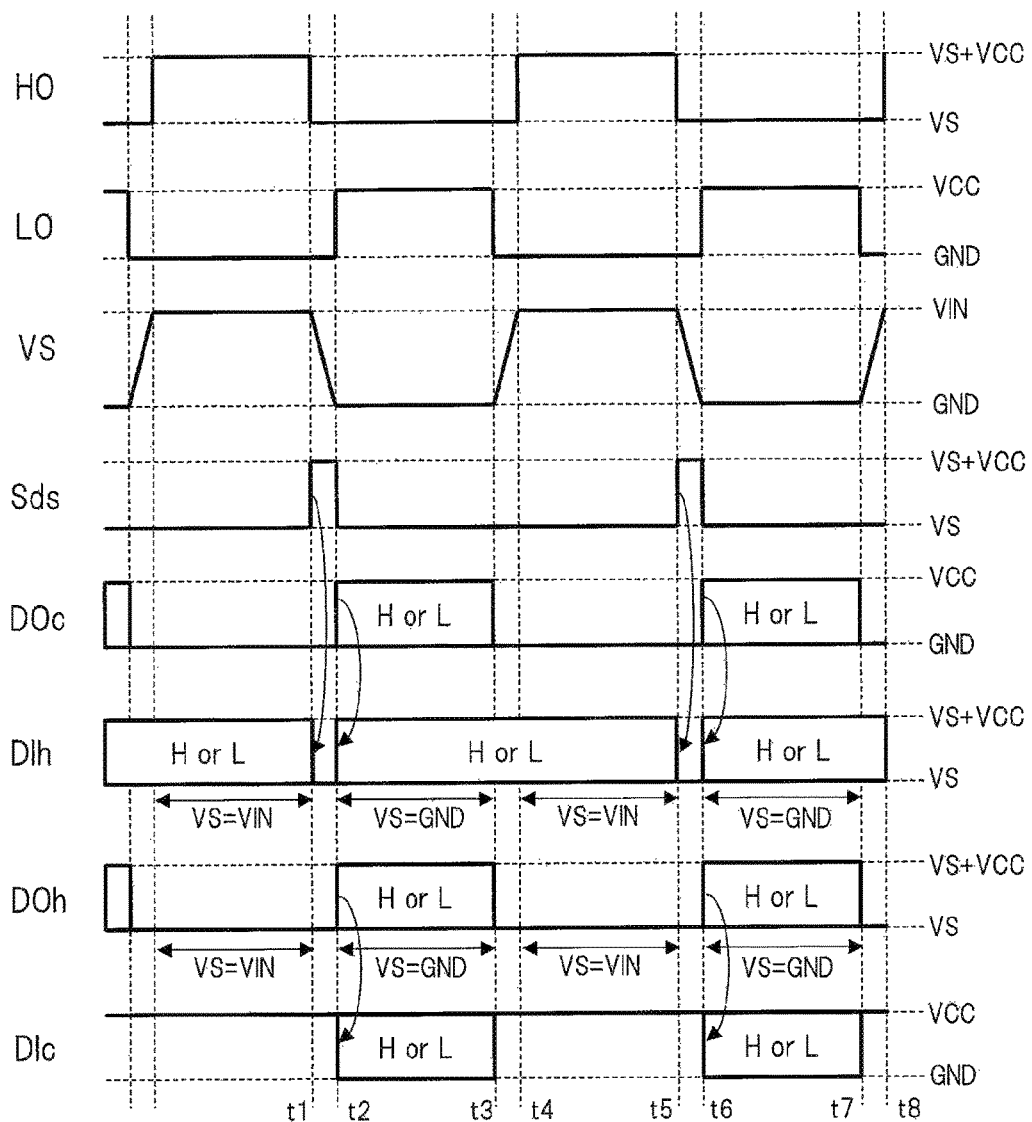
FIG. 2 is a waveform diagram illustrating a schematic operation example of the main part in the power conversion system of FIG. 1.
Figure 3A:
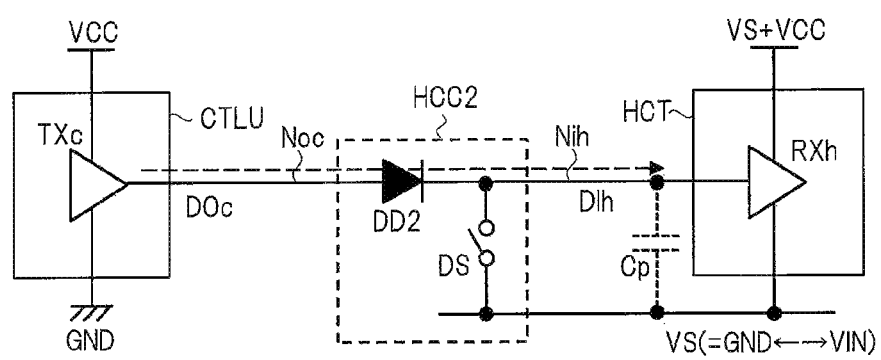
FIG. 3A is a supplementary diagram of FIG. 2, illustrating a circuit diagram in which a communication path from a controller to a high-side control circuit is extracted.
Figure 3B:
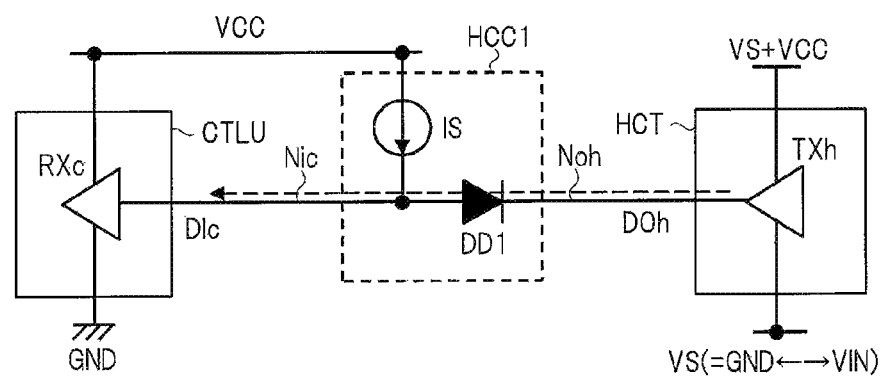
FIG. 3B is a supplementary diagram of FIG. 2, illustrating a circuit diagram in which a communication path from the high-side control circuit to the controller is extracted.

FIG. 2 is a waveform diagram illustrating a schematic operation example of the main part in the power conversion system of FIG. 1. FIG. 3A is a supplementary diagram of FIG. 2, illustrating a circuit diagram in which a communication path from a controller to a high-side control circuit is extracted, and FIG. 3B is a supplementary diagram of FIG. 2, illustrating a circuit diagram in which a communication path from the high-side control circuit to the controller is extracted.

In FIG. 2, the high-side switch signal HO and the low-side switch signal LO are signals complementarily making transitions between an "H" level and an "L" level. The voltage at the "L" level of the high-side switch signal HO is the floating voltage VS, and the voltage at the "H" level thereof is a voltage "VS+VCC" obtained by adding the power supply voltage VCC to the floating voltage VS. The voltage at the "L" level of the low-side switch signal LO is the reference power supply voltage GND, and the voltage at the "H" level thereof is the power supply voltage VCC. Also, the high-side switch signal HO and the low-side switch signal LO are provided with a dead-time period so as to prevent an occurrence of a period in which both are in an ON state.

At a time t1, along with a transition of the high-side switch signal HO to the "L" level (turning the high-side transistor TRh OFF), the floating voltage VS decreases. When the floating voltage VS becomes lower than the reference power supply voltage GND, a current path of the load LD such as a motor is switched to the freewheeling diode FDl of the low-side switch LSW. Then, after a dead-time period, when the low-side switch signal LO makes a transition to the "H" level (turning the low-side transistor TR1 ON) at a time t2, the floating voltage VS becomes the reference power supply voltage GND.

Then, at a time t3, along with a transition of the low-side switch signal LO to the "L" level (turning the low-side transistor TR1 OFF), the floating voltage VS rises. When the floating voltage VS becomes higher than the input power supply voltage VIN, the current path of the load LD is switched to the freewheeling diode FDh of the high-side switch HSW. Then, after a dead-time period, when the high-side switch signal HO makes a transition to the "H" level (turning the high-side transistor TRh ON) at a time t4, the floating voltage VS becomes the input power supply voltage VIN. Then, at times t5 to t8, operations similar to those at the times t1 to t4 are performed.

Along with the transition of the floating voltage VS as described above, as illustrated in FIG. 3A and FIG. 3B, in the receiving circuit RXh and the transmitting circuit TXh of the high-side control circuit HCT, a period in which operation is performed using the reference power supply voltage GND as a reference (times t2 to t3 of FIG. 2) and a period in which operation is performed using the input power supply voltage VIN as a reference (times t4 to t5 of FIG. 2) alternately occur. In the present specification, the former period (times t2 to t3) is referred to as a low-side period, and the latter period (times t4 to t5) is referred to as a high-side period. Here, assume a case where signal transmission is performed from the transmitting circuit Txc of the controller CTLU to the receiving circuit RXh of the high-side control circuit HCT.

First, as an initial state of the low-side period (times t2 t3), the voltage of a receiving node Nih of the receiving circuit RXh is assumed to be equal to the floating voltage VS (here, the reference power supply voltage GND). In this case, the signal DOc at the "H" level (the level of the power supply voltage VCC) from the transmitting circuit TXc of the controller CTLU is transmitted via the forward-biased diode DD2 and is received at the receiving circuit RXh as a signal DIh at the "H" level (the level of the power supply voltage VCC). Meanwhile, the signal DOc at the "L" level (the level of the reference power supply voltage GND) from the transmitting circuit TXc is also received at the receiving circuit RXh as the signal DIh at the "L" level (the level of the reference power supply voltage GND).

Then, when a transition is made to the high-side period (times t4 to t5), the voltage of the receiving node Nih of the receiving circuit RXh makes transitions along with, for example, a parasitic capacitance Cp between the voltage and the floating voltage VS, by following the transition of the floating voltage VS. In this case, when the voltage of the receiving node Nih exceeds the voltage of a transmitting node Noc of the transmitting circuit TXc, the diode DD2 becomes reverse-biased, and the receiving node Nih and the transmitting node Noc are insulated. Since the voltage of the transmitting node Noc does not exceed the power supply voltage VCC, element destruction at the transmitting circuit TXc does not occur.

As described above, in the first embodiment, signal transmission from the transmitting circuit TXc to the receiving circuit RXh is performed in the low-side period (times t2 to t3) and is not performed in the high-side period (times t4 to t5). Then, a transition is made again to the low-side period (times t6 to t7). Here, in a case where the signal DIh of the receiving node Nih in the immediately-previous low-side period (times t2 to t3) is at the "H" level (the level of the power supply voltage VCC), the receiving node Nih may still hold the "H" level in the current low-side period (times t6 to t7). In this case, since the diode DD2 becomes reverse-biased, it is impossible to transmit the signal DOc at the "L" level (the level of the reference power supply voltage GND) from the transmitting circuit TXc.

Thus, as illustrated in FIG. 2, as a preprocessing when signal transmission is performed in the low-side period (times t2 to t3 and t6 to t7) from the transmitting circuit TXc to the receiving circuit RXh, the pulldown switch DS is controlled to be in an ON state by using the switch signal Sds. In the example of FIG. 2, the high-side control circuit HCT controls the pulldown switch DS to be in an ON state in the period at the times t1 to t2 and in the period at the times t5 to t6. As a result, as described above, as an initial state in the low-side period (times t2 to t3 and t6 to t7), the voltage of the receiving node Nih of the receiving circuit RXh can be made equal to the floating voltage VS (reference power supply voltage GND), and signal transmission can be performed without problems. Note that the period in which the pulldown switch DS is controlled to be in an ON state is not restricted to that of the example of FIG. 2 and may be, for example, any period at the times t3 to t6, or may include a short period from the time t6.

Next, assume a case where signal transmission is performed from the transmitting circuit TXh of the high-side control circuit HCT to the receiving circuit RXc of the controller CTLU. In FIG. 3B, the transmitting circuit TXh transmits the signal DOh at the "H" level (the level of the power supply voltage VCC) or the "L" level (the level of the reference power supply voltage GND) in the low-side period (times t2 to t3). In this case, if the voltage of a receiving node Nic of the receiving circuit RXc is the reference power supply voltage GND and the signal DOh is at the "H" level, the diode DD1 becomes reverse-biased and therefore cannot transmit the signal DOh.

Thus, in FIG. 3B, the receiving node Nic is coupled to the power supply voltage VCC via the current source IS1 which flows a subtle current. The current source IS1 has a resistance value sufficiently higher than an output resistance of the transmitting circuit TXh. As a result, when the signal DOh is at the "H" level, the receiving circuit RXc can receive that signal as a signal DIc at the "H" level. Also, the signal DOh at the "L" level is transmitted to the receiving node Nic via the forward-biased diode DD1, and the receiving circuit RXc can receive that signal as the signal DIc at the "L" level. Note that, as described above, the current source IS1 may be a high-resistance resistor element or the like.

Then, the process makes a transition to a high-side period (times t4 to t5). Accordingly, the voltage of a transmitting node Noh makes transitions by following the transitions of the floating voltage VS, along with the parasitic capacitance Cp similar to that in the case of FIG. 3A or by the transmitting circuit TXh in output operation. In this case, when the voltage of the transmitting node Noh exceeds the voltage (power supply voltage VCC) of the receiving node Nic, the diode DD1 becomes reverse-biased, and the transmitting node Noh and the receiving node Nic are insulated. Since the voltage of the receiving node Nic is set to the power supply voltage VCC, element destruction at the receiving circuit RXc does not occur.

Then, the process makes a transition again to a low-side period (times t6 to t7), and operation similar to that in the low-side period (times t2 to t3) is performed. In this manner, in the first embodiment, signal transmission from the transmitting circuit TXh to the receiving circuit RXc via the diode DD1 is also performed in the low-side period and is not performed in the high-side period.

As described above, in the power conversion system of the first embodiment, communication between the controller CTLU and the high-side circuit HSU is performed by using the diodes DD1 and DD2. Thus, it is possible to perform communication of the high-side circuit HSU without using expensive insulating elements as illustrated in FIG. 15, and typically, a cost reduction and the like can be achieved. Also, as a result, communication paths between the controller CTLU and the high-side circuit HSU can be easily increased.

Note that, for simplification of description, communication of a digital signal making transitions between the "H" level and the "L" level is taken as an example herein. However, as apparent from the configuration and operation described above, the communication scheme of the first embodiment can be similarly applied to communication of an analog signal having any value between the "H" level and the "L" level. A specific example regarding analog signal communication will be described in a second embodiment and the like.

Second Embodiment

Schematic Configuration of Power Conversion System (Application Example [1])

Figure 4:
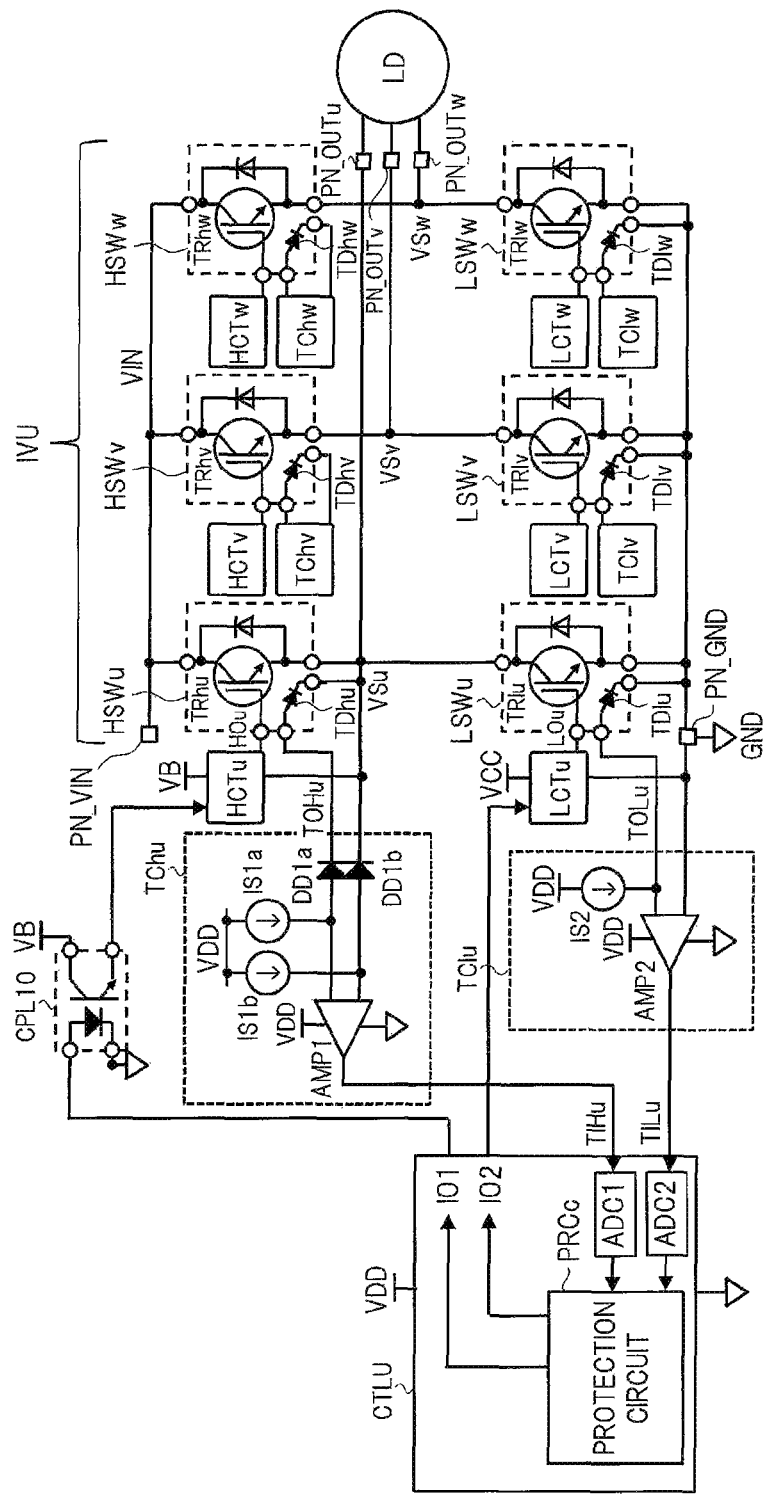
FIG. 4 is a circuit diagram illustrating a schematic configuration example of a main part in a power conversion system according to a second embodiment of the present invention.

FIG. 4 is a circuit diagram illustrating a schematic configuration example of a main part in a power conversion system according to a second embodiment of the present invention. The power conversion system illustrated in FIG. 4 includes an inverter IVU including high-side switches HSWu, HSWv, and HSWw and low-side switches LSWu, LSWv, and LSWw of three phases (u phase, v phase, and w phase) and various control circuits for the inverter IVU. The inverter IVU is supplied with the input power supply voltage VIN (for example, 600 V) using the reference power supply voltage GND as a reference. For example, by PWM (Pulse Width Modulation) control, the inverter IVU generates alternating-current voltages (floating voltages) VSu, VSv, and VSw of three phases at load drive terminals PN_OUTu, PN_OUTv, and PN_OUTw of three phases, thereby supplying power to the load LD of the motor or the like.

The various control circuits include high-side control circuits HCTu, HCTv, and HCTw which perform control, protection, and the like of the high-side switches HSWu, HSWv, and HSWw of three phases and low-side control circuits LCTu, LCTv, and LCTw which perform control, protection, and the like of the low-side switches LSWu, LSWv, and LSWw of three phases. Furthermore, the various control circuits include the controller CTLU, a photocoupler CPL10 as an insulating element, high-side temperature detection circuits TChu, TChv, and TChw of three phases, and low-side temperature detection circuits TClu, TClv, and TClw of three phases.

The controller CTLU is constituted by a microcontroller (MCU: Micro Control Unit) or the like, although not particularly limited thereto. The controller CTLU is supplied with the power supply voltage VDD (for example, 5V) and the reference power supply voltage GND, and includes analog-digital converters ADC1 and ADC2 and a protection circuit PRCc implemented by program processing of a processor or the like. The controller CTLU transmits an ON/OFF signal (for example, a PWM signal) for the high-side switch HSWu (high-side transistor TRhu) from an IO terminal IO1, and transmits an ON/OFF signal (for example, a PWM signal) for the low-side switch LSWu (low-side transistor TRlu) from an IO terminal IO2.

In response to the ON/OFF signal for the low-side switch LSWu from the controller CTLU, the low-side control circuit LCTu drives the low-side transistor TRlu via an internal low-side driver (not illustrated). Here, the low-side control circuit LCTu operates at the power supply voltage VCC such as 15 V, for example. Therefore, more specifically, for example, the low-side control circuit LCTu includes a level shift circuit which converts a signal at the power supply voltage VDD (for example, 5 V) into a signal at the power supply voltage VCC (for example, 15 V). This voltage level conversion can be achieved by, for example, a general level shift circuit constituted by an element with a withstand voltage in accordance with the power supply voltage VCC.

In contrast, to transmit the ON/OFF signal from the controller CTLU to the high-side control circuit HCTu, an insulating element is required. That is, when the communication scheme described in the first embodiment is used, the communication period is limited, and therefore, the communication scheme of the first embodiment is not suitable for transmission of the ON/OFF signal. Thus, the photocoupler CPL10 converts the voltage level (a level between the power supply voltage VDD and the reference power supply voltage GND) of an output signal of the controller CTLU to the voltage level (a level between the boot power supply voltage VB and the floating voltage VSu) of an input signal of the high-side control circuit HCTu. Although not illustrated, transmission of the ON/OFF signal from the controller CTLU to each of the v-phase control circuits (HCTv and LCTv) and each of the w-phase control circuits (HCTw and LCTw) is performed similarly to the case of the u phase.

The high-side switch HSWu includes a temperature detection diode TDhu which is formed in the semiconductor chip where the high-side switch HSWu (particularly, for example, high-side transistor TRhu) is formed and detects a temperature of the high-side switch HSWu. Similarly, the high-side switches HSWv and HSWw also include temperature detection diodes TDhv and TDhw, respectively. Also, the low-side switch LSWu includes a temperature detection diode TDlu which is formed in the semiconductor chip where the low-side switch LSWu (particularly, for example, low-side transistor TRlu) is formed and detects a temperature of the low-side switch LSWu. Similarly, the low-side switches LSWv and LSWw also include temperature detection diodes TDlv and TDlw, respectively.

Figure 5:
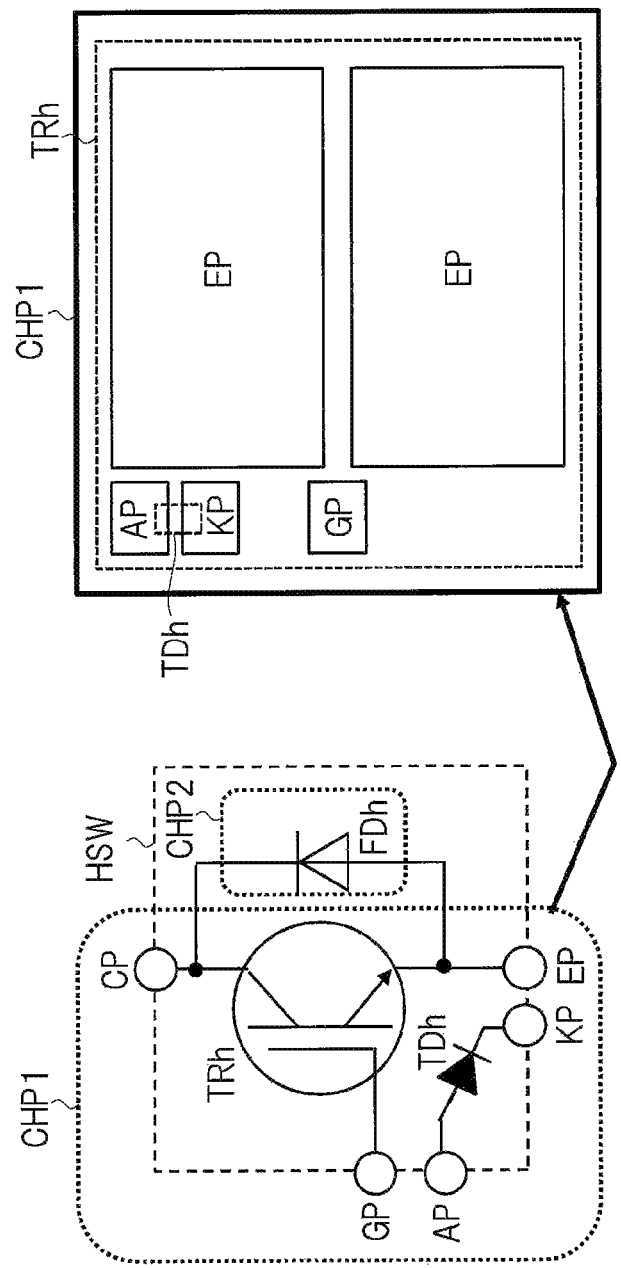
FIG. 5 is a plan view illustrating a schematic configuration example of an arrangement of a high-side switch and a low-side switch in FIG. 4.

FIG. 5 is a plan view illustrating a schematic configuration example of an arrangement of the high-side switch and the low-side switch in FIG. 4. In FIG. 5, the high-side switch HSW is constituted by two semiconductor chips CHP1 and CHP2. In the semiconductor chip CHP1, the high-side transistor TRh and the temperature detection diode TDh are formed. In the semiconductor chip CHP2, for example, the freewheeling diode FDh such as a FRD (Fast Recovery Diode) is formed.

In the example of FIG. 5, the high-side transistor TRh is constituted by an IGBT, an emitter electrode EP and a gate electrode GP are formed in a main surface of the semiconductor chip CHP1, and a collector electrode CP is formed in a back surface (not illustrated) of the semiconductor chip CHP1. The temperature detection diode TDh is constituted by, for example, forming pn-junction diffusion layers or the like in a region near the IGBT on the main surface side of the semiconductor chip CHP1. In the main surface of the semiconductor chip CHP1, an anode electrode AP coupled to the p-type diffusion layer and a cathode electrode KP coupled to the n-type diffusion layer are formed. While the high-side switch HSW has been described herein by way of example, the same goes for the low-side switch LSW.

In FIG. 4, the temperature detection circuit TChu is a circuit corresponding to the coupling circuit HCC1 of FIG. 1. The temperature detection circuit TChu includes two diodes DD1a and DD1b, two current sources IS1a and IS1b, and a differential amplifying circuit AMP1. The diode DD1a has a cathode coupled to the anode of the temperature detection diode TDhu, and the diode DD1b has a cathode coupled to the cathode of the temperature detection diode TDhu. Also, the cathode of the temperature detection diode TDhu is coupled also to a load drive terminal PN_OUTu (floating voltage VSu).

The current source IS1a is coupled between the power supply voltage VDD and the anode of the diode DD1a and flows a current in a forward direction to the temperature detection diode TDhu via the diode DD1a. The current source IS1b is coupled between the power supply voltage VDD and the anode of the diode DD1b and flows a current in a forward direction to the diode DD1b. The differential amplifying circuit AMP1 detects a differential voltage between the anode of the diode DD1a and the anode of the diode DD1b and transmits the detection result to the analog-digital converter ADC1 of the controller CTLU. Although not illustrated, details of the temperature detection circuits TChv and TChw are similar to those of the temperature detection circuit TChu.

Meanwhile, the temperature detection circuit TClu is a circuit corresponding to the coupling circuit LCC of FIG. 1. The temperature detection circuit TClu includes a current source IS2 and a differential amplifying circuit AMP2. The current source IS2 is coupled between the power supply voltage VDD and the anode of the temperature detection diode TDlu and flows a current in a forward direction to the temperature detection diode TDlu. The cathode of the temperature detection diode TDlu is coupled to the reference power supply terminal PN_GND (reference power supply voltage GND). The differential amplifying circuit AMP2 detects a differential voltage between the anode and the cathode of the temperature detection diode TDlu and transmits the detection result to the analog-digital converter ADC2 of the controller CTLU. Although not illustrated, details of the temperature detection circuits TClv and TClw are similar to those of the temperature detection circuit TClu.

Schematic Operation of Power Conversion System (Application Example [1])

Figure 6:
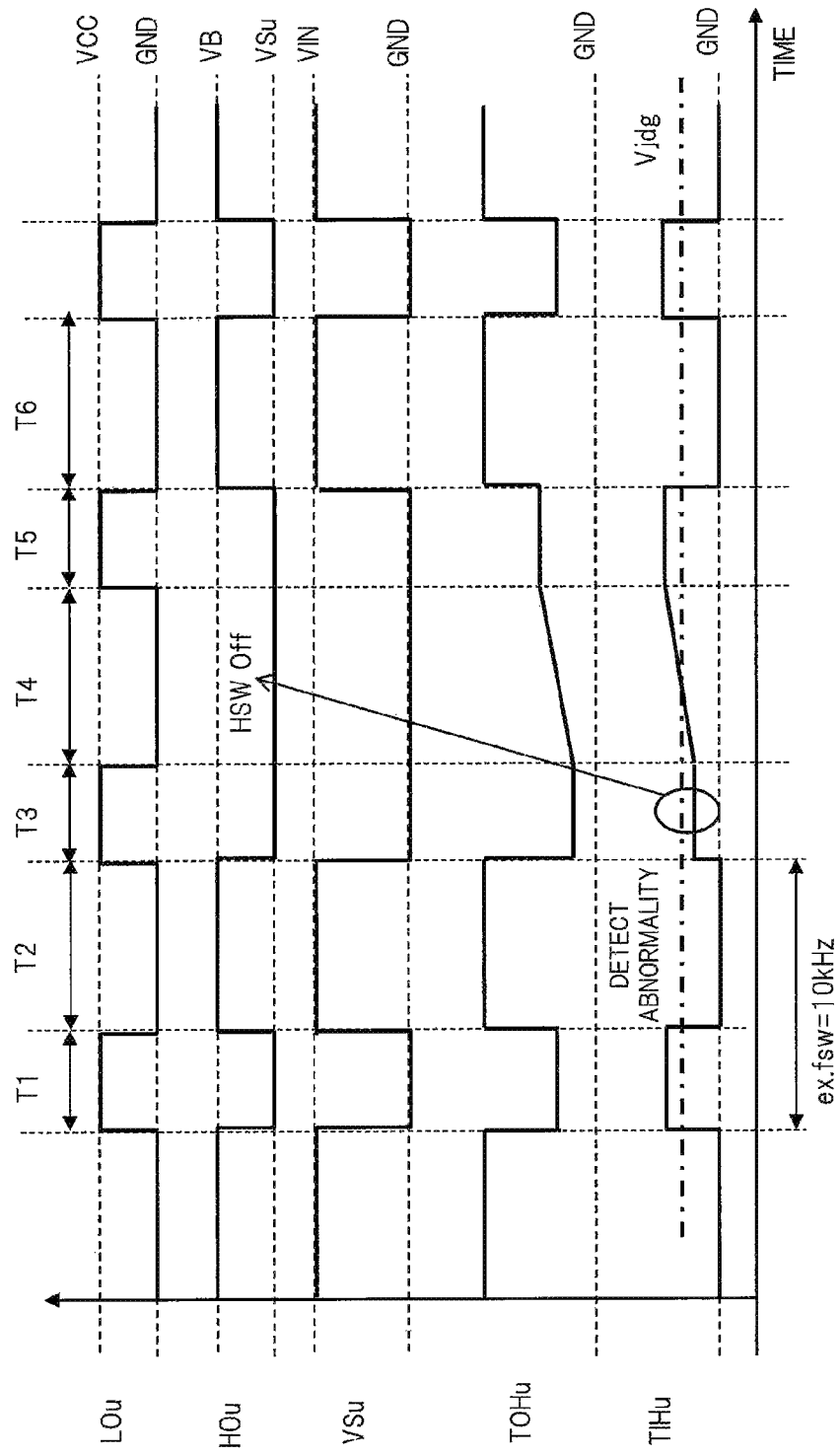
FIG. 6 is a waveform diagram illustrating a schematic operation example of the main part in the power conversion system of FIG. 4.

FIG. 6 is a waveform diagram illustrating a schematic operation example of the main part in the power conversion system of FIG. 4. While operation of the u phase in FIG. 4 will be described herein by way of example, the same goes for the v phase and the w phase. In a period T1 of FIG. 6, a low-side switch signal LOu serving as a gate input of the low-side transistor TRlu is at the "H" level, and a high-side switch signal HOu serving as a gate input of the high-side transistor TRhu is at the "L" level. This period T1 is the low-side period described in the first embodiment. In the period T1, a current from the current source IS1a flows via the forward-biased diode DD1a to the temperature detection diode TDhu, and a current from the current source IS1b flows through the forward-biased diode DD1b.

In this case, in the temperature detection diode TDhu, a forward voltage depending on temperature (particularly, having a negative temperature characteristic) occurs. At the anode of the temperature detection diode TDhu, a temperature voltage signal TOHu in accordance with the forward voltage using the floating voltage VSu as a reference is generated. The current values from the current sources IS1a and IS1b are equal and each have, for example, a value smaller than 1 mA, although not particularly limited thereto. The differential amplifying circuit AMP1 detects a forward voltage of the temperature detection diode TDhu in the low-side period via the diodes DD1a and DD1b.

In particular, to the differential amplifying circuit AMP1, a voltage value obtained by adding the forward voltage of the diode DD1a to the temperature voltage signal TOHu and a voltage value obtained by adding the forward voltage of the diode DD2a (the same value as that of the diode DD1a) to the floating voltage VSu are input. The differential amplifying circuit AMP1 performs differential amplification of the input voltage and transmits a temperature voltage signal TIHu as the amplification result to the controller CTLU. In the controller CTLU, the analog-digital converter ADC1 converts the temperature voltage signal TIHu to a digital value, and the digital value is compared with a determination voltage Vjdg defined in advance by using the protection circuit PRCc. In the period T1, the voltage level of the temperature voltage signal TIHu is higher than the judgment voltage Vjdg, and therefore, the protection circuit PRCc determines the temperature as normal.

In a period T2, the low-side switch signal LOu is at the "L" level, and the high-side switch signal HOu is at the "H" level. This period T2 is a high-side period described in the first embodiment. In the period T2, the diodes DD1a and DD1b become reverse-biased, and therefore, temperature detection by the temperature detection diode TDhu is no performed.

Next, a period T3 is a low-side period again. In the example of FIG. 6, in the period T3, the temperature detection diode TDhu is in an abnormally high temperature state. Accordingly, the voltage level of the temperature voltage signal TIHu is lower than the determination voltage Vjdg. As a result, the protection circuit PRCc determines the temperature as abnormal temperature and in a period 14, for example, performs protecting operation via the IO terminal IO1 to define the high-side switch signal HOu, which is originally at the "H" level, as being at the "L" level.

As a result, current ceases to flow to the high-side transistor TRhu. Therefore, the temperature detection diode TDhu gets close to the normal temperature. In a period T5, the controller CTLU performs operation in the low-side period again and confirms that the temperature detection diode TDhu returns to the normal temperature. In response to this, the controller CTLU returns to normal operation. Note that, although not particularly limited thereto, a switching frequency fsw of each of the low-side switch signal LOu and the high-side switch signal HOu is 10 kHz or the like.

<<Structure of High-Withstand-Voltage Diode>>

Figure 7A:
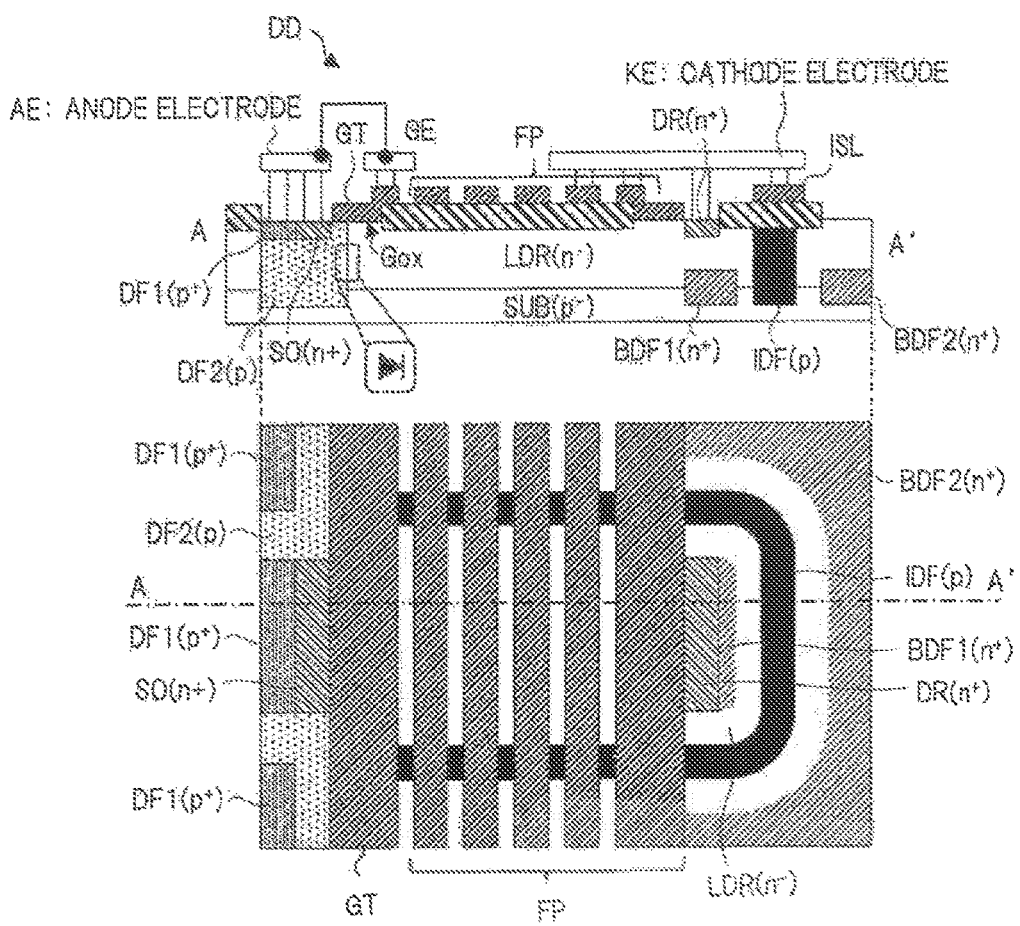
FIG. 7A is a cross-sectional view and a plan view illustrating an example of a structure of a diode in a temperature detection circuit in FIG. 4.
Figure 7B:
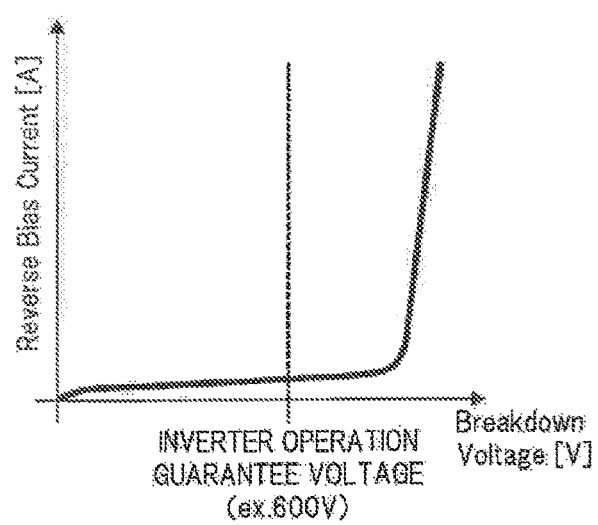
FIG. 7B is a diagram illustrating an example of withstand voltage characteristics in the diode of FIG. 7A.

FIG. 7A is a cross-sectional view and a plan view illustrating an example of a structure of the diode in the temperature detection circuit in FIG. 4, and FIG. 7B is a diagram illustrating an example of withstand voltage characteristics in the diode of FIG. 7A. FIG. 7A illustrates a plan view of the diode and a cross-sectional view taken along an A-A' line in the plan view. A diode DD illustrated in FIG. 7A is constituted by a parasitic diode of a MOS transistor.

In particular, in FIG. 7A, a drift layer LDR as an n⁻-type epitaxial layer is formed on a p⁻-type semiconductor substrate SUB. The drift layer LDR is isolated by a p-type diffusion layer DF2 and a p-type isolation layer IDF which extend so as to be connected to the semiconductor substrate SUB from a main surface (in other words, an element formation surface) side. On a main surface side of the p-type diffusion layer DF2, a p$^+$-type diffusion layer DF1 with an impurity concentration higher than that of the p-type one is disposed. Also, in a region on the main surface side of the diffusion layer DF2 between the diffusion layer DF1 and the drift layer LDR, an n$^+$-type source diffusion layer SO with an impurity concentration higher than that of the n$^-$-type one is disposed. The diffusion layer DF1 and the source diffusion layer SO are coupled to an anode electrode AE formed of a contact layer and a metal layer.

On the diffusion layer DF2 between the source diffusion layer SO and the drift layer LDR, a gate layer GT constituted by polysilicon or the like is disposed via a gate insulating film GOX. A region immediately below the gate insulating film GOX between the source diffusion layer SO and the drift layer LDR serves as a channel region. The gate layer GT is coupled to a gate electrode GE formed of a contact layer and a metal layer. Also, the gate layer GT is coupled to the anode electrode AE.

An n$^+$-type drain diffusion layer DR is disposed on a main surface side of the drift layer LDR near the isolation layer IDF. The drain diffusion layer DR is coupled to the cathode electrode KE formed of a contact layer and a metal layer. An insulating film ISL is formed on the drift layer LDR, and a field plate FP constituted by polysilicon or the like is disposed on the insulating film ISL. In a portion located below the drain diffusion layer DR on the semiconductor substrate SUB, an n$^+$-type buried layer BDF1 is disposed. An n$^+$-type buried layer BDF2 is also disposed on a side opposed to the buried layer BDF1 across the isolation layer IDF.

In this manner, FIG. 7A illustrates a structure such that a short circuit is made between the gate and the source in a MOS transistor with the source diffusion layer SO serving as a source and the drift layer LDR and the drain diffusion layer DR serving as a drain. As a result, the MOS transistor is always in an OFF state and functions as a parasitic diode (or body diode) with the p$^+$-type diffusion layer DF1 and the p-type diffusion layer DF2 serving as an anode and the n$^-$-type drift layer LDR and the n$^+$-type drain diffusion layer DR serving as a cathode.

Also, the MOS transistor (parasitic diode) includes the drift layer LDR to have high withstand voltage. The field plate FP has, although not illustrated, one end on a side near the anode electrode AE coupled to the anode electrode AE and the other end on a side near the cathode electrode KE coupled to the cathode electrode KE, thereby being one line connecting the cathode electrode KE and the anode electrode AE as being folded back. As a result, the voltage of the field plate FP decreases from the side near the cathode electrode KE toward the side near the anode electrode AE in a stepwise manner. By providing such a voltage gradient, for example, spread of a depletion layer formed in the drift layer LDR can be made uniform.

The diode DD illustrated in FIG. 7A has a breakdown voltage exceeding an operation guarantee voltage (for example, the input power supply voltage VIN such as 600 V) of the inverter IVU, as illustrated in FIG. 7B. The diode DD is not particularly limited to the example of the structure as illustrated in FIG. 7A as long as the structure has a breakdown voltage exceeding the operation guarantee voltage of the inverter IVU as illustrated in FIG. 7B, and a general-purpose discrete component or the like can be used.

Main Effects of Second Embodiment

Figure 16:
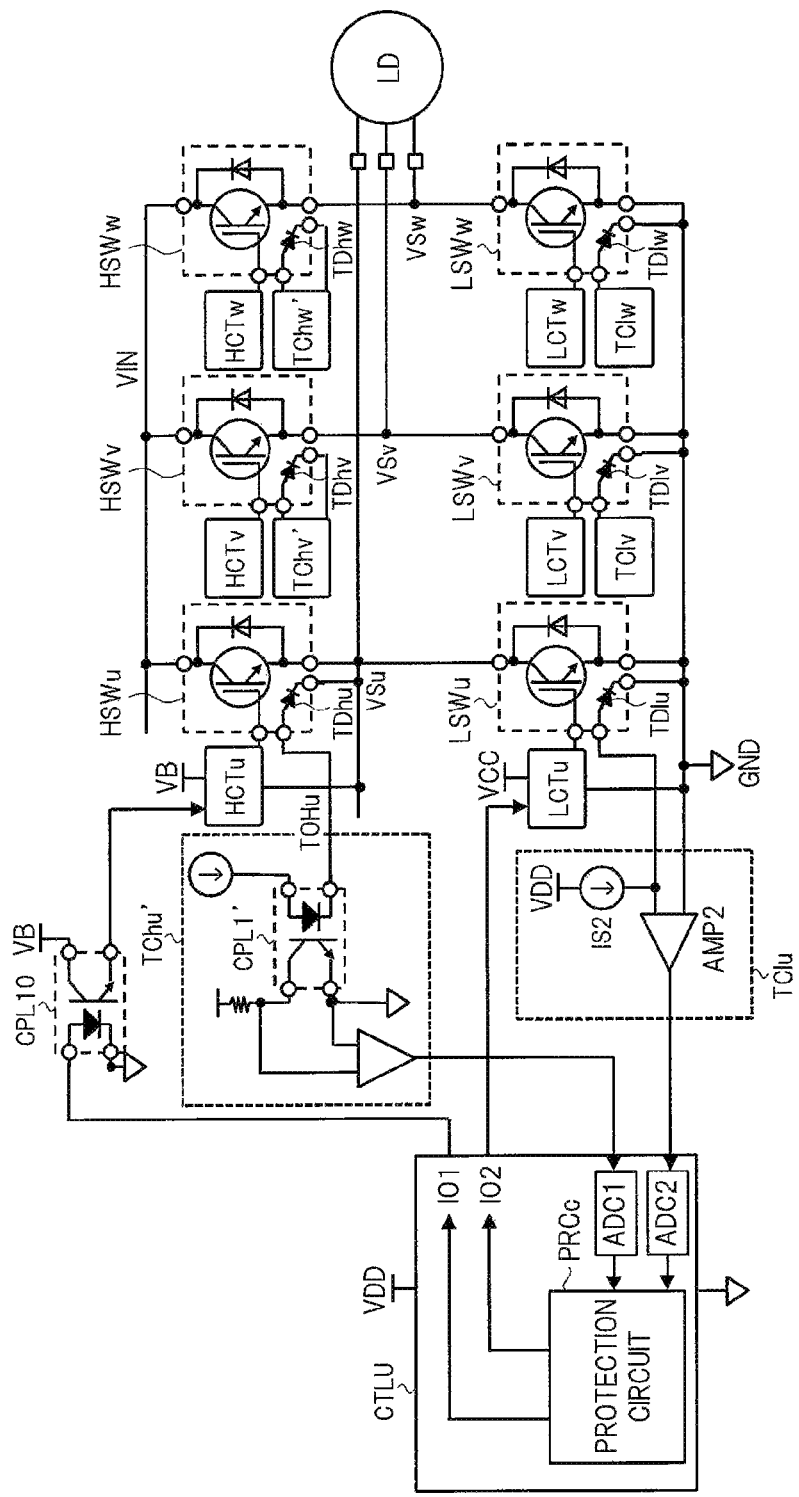
FIG. 16 is a circuit diagram illustrating another schematic configuration example of the main part in the power conversion system according to the comparative example of the present invention.
Figure 17:
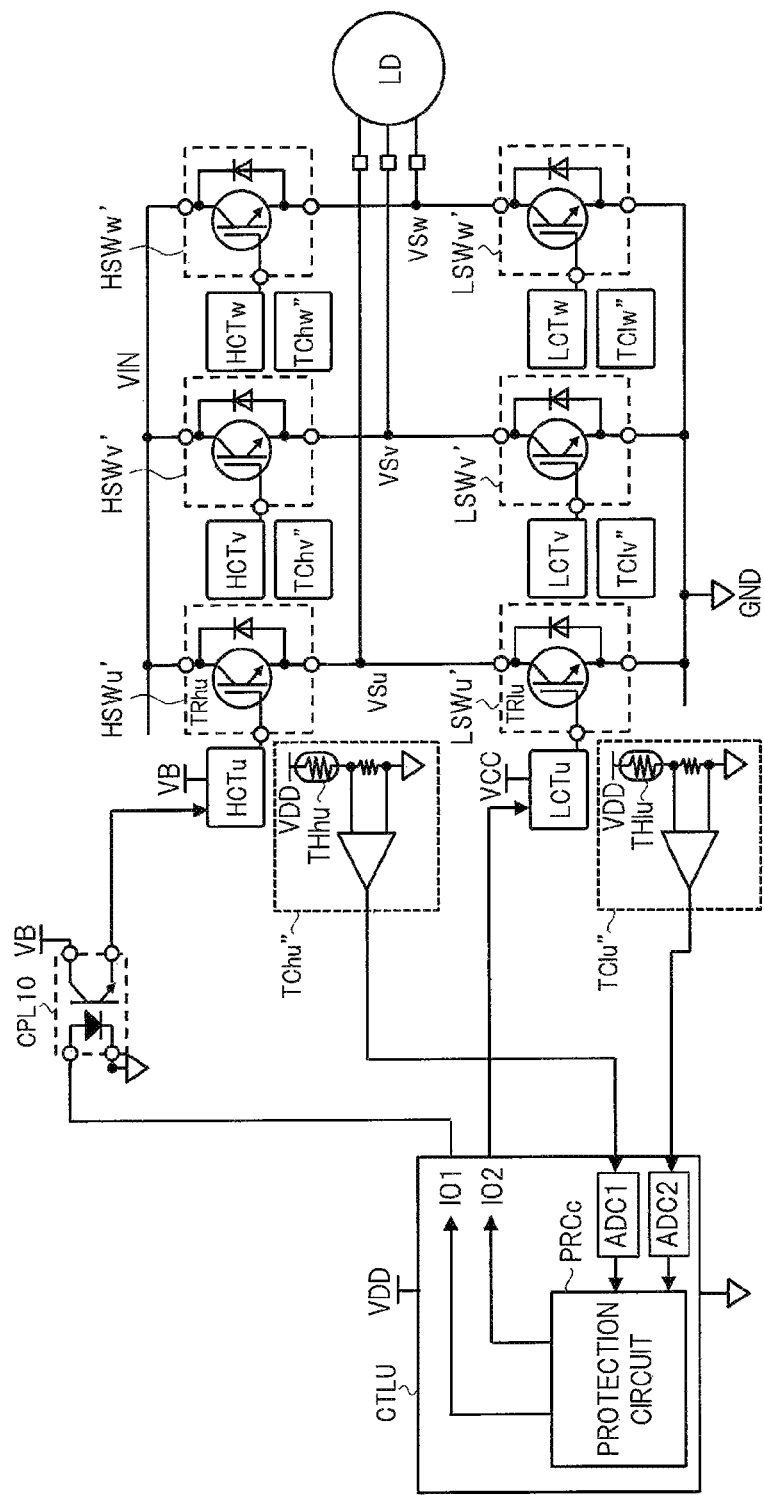
FIG. 17 is a circuit diagram illustrating still another schematic configuration example of the main part in the power conversion system according to the comparative example of the present invention.

FIG. 16 is a circuit diagram illustrating another schematic configuration example of the main part in the power conversion system according to the comparative example of the present invention, and FIG. 17 is a circuit diagram illustrating still another schematic configuration example of the main part in the power conversion system according to the comparative example of the present invention. The power conversion system illustrated in FIG. 16 is different in the circuit scheme of high-side temperature detection circuits TChu', TChv', and TChw' compared with the configuration example of FIG. 4. For example, the temperature detection circuit TChu' includes the photocoupler CPL1' and transmits the temperature voltage signal TOHu from the temperature detection diode TDhu to the controller CTLU via the photocoupler CPL1'. When this scheme is used, it is required to have an expensive insulating element such as a photocoupler provided in each of the temperature detection circuits TChu', TChv', and TChw'. Therefore, as described in the first embodiment, a cost increase may be caused.

In contrast, the power conversion system illustrated in FIG. 17 is different in the configurations of high-side switches HSWu', HSWv', and HSWw', low-side switches LSWu', LSWv', and LSWw', and temperature detection circuits TChu'', TChv'', TChw'', TClu'', TClv'', and TClw'' compared with the configuration example of FIG. 4. The temperature detection circuits of the respective high-side switches and the respective low-side switches do not include a temperature detection diode, and instead, each temperature detection circuit includes a thermistor.

For example, the u-phase high-side temperature detection circuit TChu'' includes a thermistor THhu and transmits a temperature detection signal obtained by the thermistor THhu to the controller CTLU. Similarly, the u-phase low-side temperature detection circuit TClu'' includes a thermistor THlu and transmits a temperature detection signal obtained by the thermistor THlu to the controller CTLU. The thermistor THhu is constituted by a component different from the semiconductor chip (CHP1 of FIG. 5) of the high-side transistor TRhu and is disposed, for example, so as to be in proximity with the semiconductor chip. Similarly, the thermistor THlu is constituted by a component different from the semiconductor chip of the low-side transistor TRlu and is disposed, for example, so as to be in proximity with the semiconductor chip.

When the scheme as described above is used, the thermistor THhu is provided outside the high-side transistor TRhu, thereby enabling operation at a power supply voltage (for example, the power supply voltage VDD and the reference power supply voltage GND) different from that of the high-side transistor TRhu. As a result, an insulating element as in the case of FIG. 16 is not required, thereby achieving a cost reduction. However, since the thermistor THhu and the high-side transistor TRh are different components, the temperature detection result obtained by the thermistor THhu is different from an actual temperature of the high-side transistor TRh. Moreover, responsivity to a transient temperature change is also low. In this case, for example, an excessive margin has to be secured in heat dissipation designing and the like.

Thus, when the scheme of the second embodiment is used, the problems described with reference to FIG. 16 and FIG. 17 can be solved, and temperature detection can be achieved at low cost and with sufficient accuracy. In particular, for example, the temperature detection result can be transmitted via an inexpensive diode in place of an expensive insulating element, and an excessive margin in heat dissipation designing and the like can be eliminated, so that a cost reduction can be achieved.

Third Embodiment

<<Schematic Configuration and Schematic Operation of Driver IC (Integrated Circuit)>>

Figure 8:
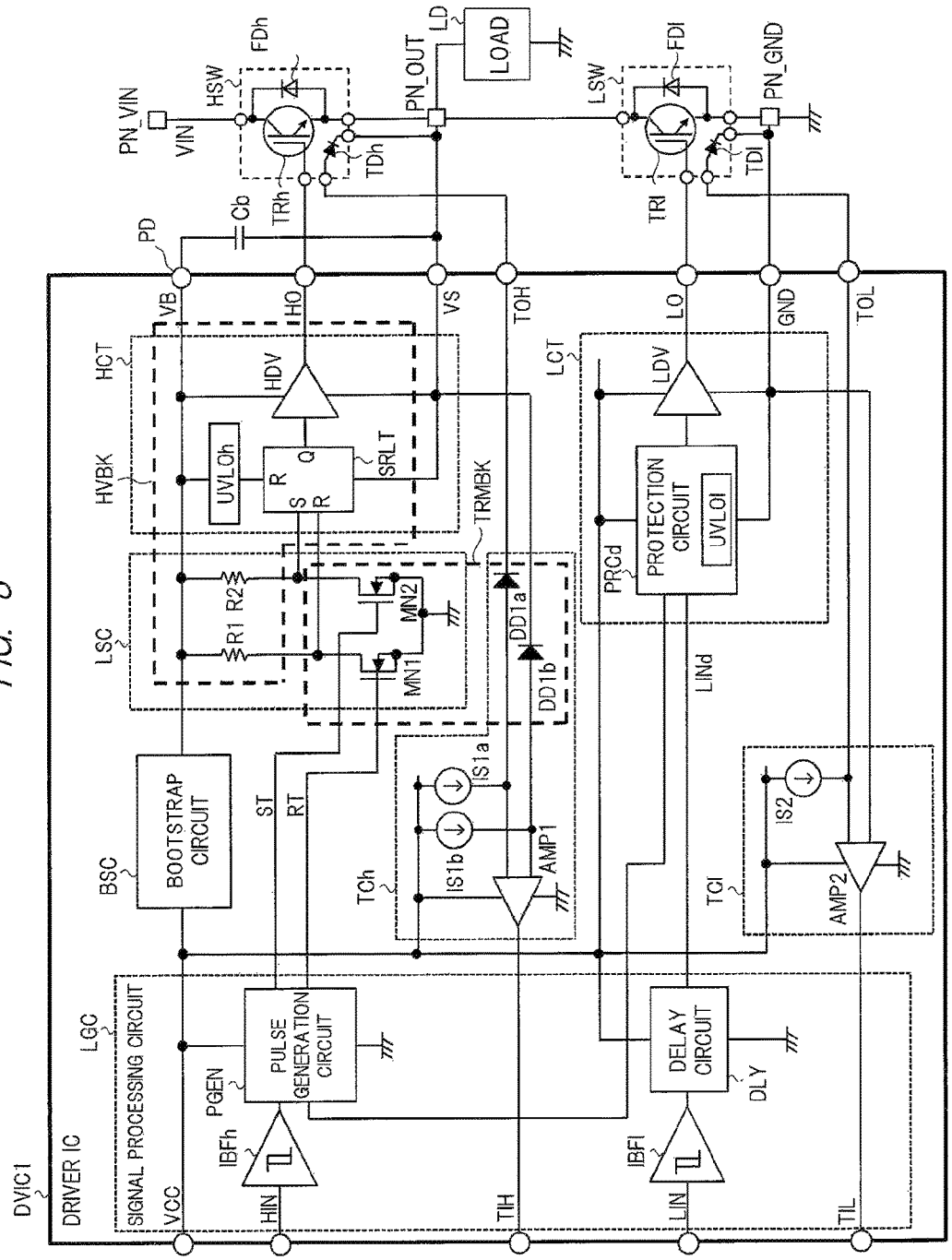
FIG. 8 is a circuit block diagram illustrating a schematic configuration example of a semiconductor device according to a third embodiment of the present invention.

FIG. 8 is a circuit block diagram illustrating a schematic configuration example of a semiconductor device according to a third embodiment of the present invention. A driver IC (semiconductor device) DVIC1 illustrated in FIG. 8 is configured such that, for example, the high-side control circuit (HCTu), the low-side control circuit (LCTu), and the temperature detection circuits (TChu and TClu) for one phase (for example, u phase) in FIG. 4 are built in a single semiconductor chip.

The driver IC (DVIC1) is constituted by a single semiconductor chip and includes a plurality of pads (terminals) PD, a signal processing circuit LGC, a bootstrap circuit BSC, a level shift circuit LSC, a high-side control circuit HCT, a low-side control circuit LCT, and temperature detection circuits TCh and TCl. Also herein, a configuration example including, in addition to the driver IC (DVIC1), a high-side switch HSW, a low-side switch LSW, a bootstrap capacitor Cb, and a load LD, which are externally provided, is disclosed.

The high-side switch HSW is coupled between the input power supply terminal PN_VIN and the load drive terminal PN_OUT, and the low-side switch LSW is coupled between the load drive terminal PN_OUT and the reference power supply terminal PN_GND. To the input power supply terminal PN_VIN, using a reference power supply voltage GND (0 V) of the reference power supply terminal PN_GND as a reference, an input power supply voltage VIN of, for example, 600 V, is supplied. Also, the load drive terminal PN_OUT is coupled to the floating voltage VS, and the floating voltage VS makes transitions between the reference power supply voltage GND and the input power supply voltage VIN, as described above.

In the driver IC (DVIC1), the pad PD (VCC) is a power supply terminal to which a power supply voltage VCC is supplied. The power supply voltage VCC is, for example, 15 V or the like, using the reference power supply voltage GND as a reference. The pad PD (HIN) is a terminal which receives a high-side ON/OFF signal HIN from a controller CTLU not illustrated. The pad PD (TIH) is a terminal which transmits a temperature voltage signal TIH from the temperature detection circuit TCh to the controller CTLU. The pad PD (LIN) is a terminal which receives a low-side ON/OFF signal LIN from the controller CTLU. The pad PD (TIL) is a terminal which transmits a temperature voltage signal TIL from the temperature detection circuit TCl to the controller CTLU.

The pad PD (VB) is a power supply terminal to which the boot power supply voltage VB is supplied. The boot power supply voltage VB is a voltage obtained by adding the power supply voltage VCC to the floating voltage VS, as described with reference to FIG. 1. The pad PD (HO) is a terminal which transmits the high-side switch signal HO to the high-side switch HSW. The pad PD (VS) is a load drive terminal coupled to the floating voltage VS. The bootstrap capacitor Cb is coupled between the pad PD (VB) and the pad PD (VS).

The pad PD (TOH) is a terminal which receives a temperature voltage signal TOH from the temperature detection diode TDh of the high-side switch HSW. The pad PD (LO) is a terminal which transmits the low-side switch signal LO to the low-side switch LSW. The pad PD (GND) is a reference power supply terminal to which the reference power supply voltage GND is supplied. The pad PD (TOL) is a terminal which receives a temperature voltage signal TOL from a temperature detection diode TDl of the low-side switch LSW.

The signal processing circuit LGC includes a high-side input buffer IBFh, a low-side input buffer IBFl, a pulse generation circuit PGEN, and a delay circuit DLY. The high-side input buffer IBFh converts the high-side ON/OFF signal HIN received at the pad PD (HIN) into a signal at the level of the power supply voltage VCC and outputs the converted signal to the pulse generation circuit PGEN. The low-side input buffer IBFl converts the low-side ON/OFF signal LIN received at the pad PD (LIN) into a signal at the level of the power supply voltage VCC and outputs the converted signal to the delay circuit DLY. The input buffer IBFh and IBFl are each constituted by, for example, a Schmitt trigger circuit or the like, to remove input noise.

The pulse generation circuit PGEN and the delay circuit DLY operate at the power supply voltage VCC using the reference power supply voltage GND as a reference. Upon reception of an output signal of the high-side input buffer IBFh, the pulse generation circuit PGEN generates a set signal ST at either one of a rising edge and a falling edge of the output signal and generates a reset signal RT at the other edge. The set signal ST and the reset signal RT are each, for example, a one-shot pulse signal. The delay circuit DLY adds a delay as a dead-time period to the output signal of the low-side buffer IBFl and outputs a low-side ON/OFF signal LINd after delay.

The high-side control circuit HCT includes a high-side driver HDV, an SR latch circuit SRLT, and a high-side low-voltage detection circuit UVLOh, and they operate at the boot power supply voltage VB using the floating voltage VS as a reference. The high-side driver HDV is constituted by, for example, a CMOS inverter with an output signal (Q) of the SR latch circuit SRLT as an input and drives the high-side transistor TRh by transmitting the high-side switch signal HO to the pad PD (HO).

In response to a set input (S) and a reset input (R), the SR latch circuit SRLT controls the high-side switch signal HO via the high-side driver HDV. In particular, in response to the set input (S), the SR latch circuit SRLT controls the high-side switch signal HO to the level of the boot power supply voltage VB, and in response to the reset input (R), the SR latch circuit SRLT controls the high-side switch signal HO to the level of the floating voltage VS. The high-side low-voltage detection circuit UVLOh provides a reset input (R) to the SR latch circuit SRLT when the value of the boot power supply voltage VB using the floating voltage VS as a reference does not reach a predetermined voltage value. As a result, the high-side transistor TRh is fixed to OFF until the value of the boot power supply voltage VB reaches the predetermined voltage value.

The level shift circuit LSC includes two NMOS transistors (referred to as level shift MOSes) MN1 and MN2 and two resistors R1 and R2. The level shift MOSes (MN1 and MN2) each have a source coupled to the reference power supply voltage GND and a drain coupled to the boot power supply voltage VB via each of the resistors R1 and R2. In this manner, the boot power supply voltage VB is applied between the source and the drain of each transistor of the level shift MOSes (MN1 and MN2) using the reference power supply voltage GND as a reference, and therefore, the level shift MOS (MN1 and MN2) has to be a high-withstand-voltage element.

In response to the set signal ST, the level shift MOS (MN2) flows a predetermined pulse current to the resistor R2, thereby converting the voltage level of the set signal ST into a voltage level conforming to the set input (S) of the SR latch circuit SRLT. Similarly, in response to the reset signal RT, the level shift MOS (MN1) flows a predetermined pulse current to the resistor R1, thereby converting the voltage level of the reset signal RT into a voltage level conforming to the reset input (R) of the SR latch circuit SRLT. In this manner, the level shift circuit LSC is a circuit which serves a function similar to that of the insulating element described with reference to FIG. 4 (in the example of FIG. 4, the photocoupler CPL10), converting a signal using the reference power supply voltage GND as a reference into a signal using the floating voltage VS as a reference.

The low-side control circuit LCT includes a low-side driver LDV and a protection circuit PRCd including a low-side low-voltage detection circuit UVLOl, and they operate at the power supply voltage VCC using the reference power supply voltage GND as a reference. The low-side driver LDV is constituted by, for example, a CMOS inverter with an output signal of the protection circuit PRCd as an input and drives the low-side transistor TRl by transmitting a low-side switch signal LO to the pad PD (LO).

When the value of the power supply voltage VCC does not reach a predetermined voltage value, the low-side low-voltage detection circuit UVLOl controls the low-side switch signal LO to the level of the reference power supply voltage GND via the low-side driver LDV. As a result, the low-side transistor TRl is fixed to OFF until the value of the power supply voltage VCC reaches the predetermined voltage value. Also, when the value of the power supply voltage VCC does not reach a predetermined value, the low-side low-voltage detection circuit UVLOl notifies the pulse generation circuit PGEN. Upon reception of the notification, the pulse generation circuit PGEN stops at least generating the set signal ST, and as a result, the high-side transistor TRh is also fixed to OFF until the value of the power supply voltage VCC reaches the predetermined voltage value.

The protection circuit PRCd performs various protections of the low-side transistor TRl typified by, for example, protection by the low-side low-voltage detection circuit UVLOl as described above and protection at the time of detecting short circuit of a load via the diode Ddes as described with reference to FIG. 1. In a period where protection associated with abnormality as described above is not required, the protection circuit PRCd outputs an output signal of the delay circuit DLY to the low-side driver LDV.

The bootstrap circuit BSC includes a configuration equivalent to that of the bootstrap diode Db described with reference to FIG. 1 and charges the bootstrap capacitor Cb as appropriate so that the charging voltage of the bootstrap capacitor Cb can hold the power supply voltage VCC. As with the case of FIG. 4, the temperature detection circuit TCl includes a current source IS2 and a differential amplifying circuit AMP2. The power supply voltage VCC is supplied to the current source IS2 and the differential amplifying circuit AMP2. The differential amplifying circuit AMP2 has an input node coupled to the pad PD (TOL) and the pad PD (GND) and an output node coupled to the pad PD (TIL).

As with the case of FIG. 4, the temperature detection circuit TCh also includes the diodes DD1a and DD1b, the current sources IS1a and IS1b, and the differential amplifying circuit AMP1. The power supply voltage VCC is supplied to the current sources IS1a and IS1b and the differential amplifying circuit AMP1. The cathode of the diode DD1a is coupled to the pad PD (TOH), and the cathode of the diode DD1b is coupled to the pad PD (VS). Also, the output node of the differential amplifying circuit AMP1 is coupled to the pad PD (TIH). Although not illustrated, for example, a level shift circuit which converts a signal at the level of the power supply voltage VCC (for example, 15 V) into a signal at the level of the power supply voltage VDD (for example, 5 V) may be provided at a previous stage of the pad PD (TIH) and the pad (TIL).

<<Schematic Layout Configuration of Driver IC (Semiconductor Device)>>

Figure 9:
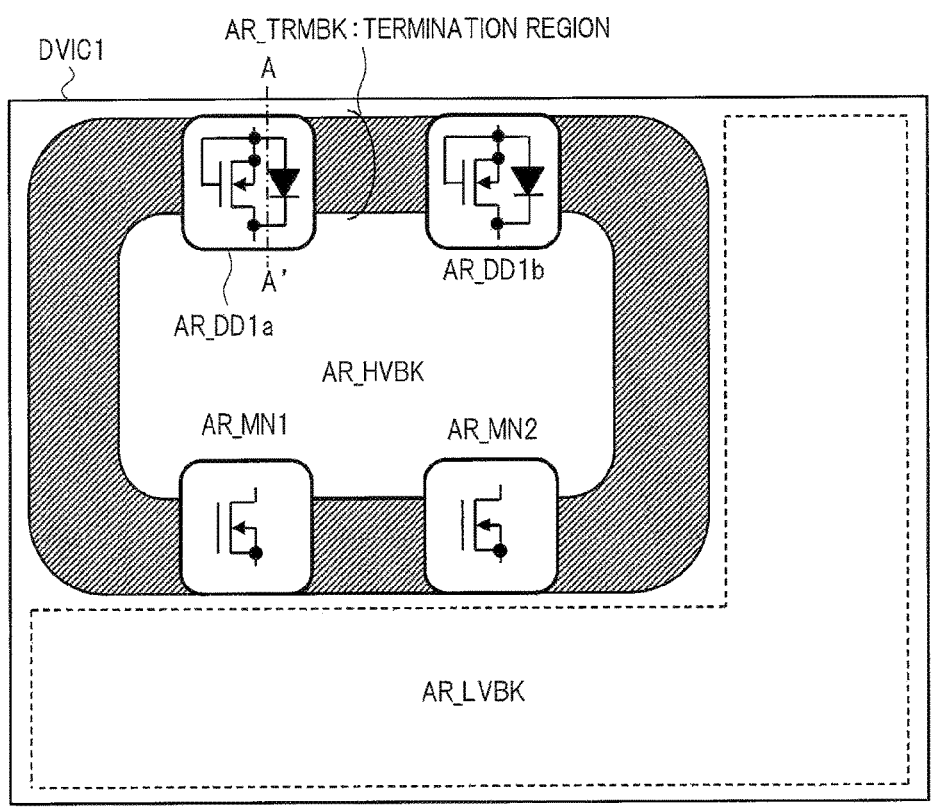
FIG. 9 is a plan view illustrating a schematic configuration example of a layout in the semiconductor device of FIG. 8.

FIG. 9 is a plan view of a schematic configuration example of a layout in the semiconductor device of FIG. 8. The semiconductor device (driver IC) DVIC1 illustrated in FIG. 8 is constituted by a single semiconductor chip. In this semiconductor chip, a termination region AR_TRMBK, a low-voltage region AR_LVBK, and a high-voltage region AR_HVBK are formed. The termination region AR_TRMBK is a region in a ring shape, isolating and coupling a circuit which operates at the power supply voltage VCC and a circuit which operates at the boot power supply voltage VB.

In the termination region AR_TRMBK, each circuit illustrated in a termination part TRMBK of FIG. 8 is formed. Specifically, the termination region AR_TRMBK is provided with a region AR_MN1 of the level shift MOS (MN1), a region AR_MN2 of the level shift MOS (MN2), a region AR_DD1a of the diode DD1a, and a region AR_DD1b of the diode DD1b. In the termination region AR_TRMBK, for example, a transistor (or a diode) having a withstand voltage equal to or higher than 300 V, desirably a withstand voltage equal to or higher than 600 V, between the source and the drain (or between the anode and the cathode), is formed.

The low-voltage region AR_LVBK is provided outside the termination region AR_TRMBK, and a circuit which operates at the power supply voltage VCC using the reference power supply voltage GND as a reference is formed in the low-voltage region AR_LVBK. Specifically, in the low-voltage region AR_LVBK, the signal processing circuit LGC, the low-side control circuit LCT, the low-side temperature detection circuit TCl, and the current sources IS1a and IS1b and the differential amplifying circuit AMP1 in the high-side temperature detection circuit TCh of FIG. 8 are formed. The high-voltage region AR_HVBK is provided inside the termination region AR_TRMBK, and a circuit which operates at the boot power supply voltage VB using the floating voltage VS as a reference is formed in the high-voltage region AR_HVBK. Specifically, in the high-voltage region AR_HVBK, the high-side control circuit HCT and the resistors R1 and R2 in the level shift circuit LSC, as illustrated in a high-voltage circuit part HVBK of FIG. 1, are formed.

The diodes DD1a and DD1b formed in the regions AR_DD1a and AR_DD1b, respectively, can use, for example, the structure of FIG. 7A described above. In this case, for example, the plan structure and the cross-sectional structure along the A-A' line of the region AR_DD1a of FIG. 9 are those illustrated in FIG. 7A. The p-type isolation layer IDF illustrated in the plan view of FIG. 7A corresponds to a boundary portion of the region AR_DD1a of FIG. 9. Also, the $n^+$-type buried layer BDF2 illustrated in FIG. 7A corresponds to a layer extending to the entire surface of the high-voltage region AR_HVBK of FIG. 9 and supplied with the boot power supply voltage VB.

The level shift MOSes (MN1 and MN2) formed in the regions AR_MN1 and AR_MN2, respectively, can also use a structure approximately similar to that of FIG. 7A. That is, in the diode DD of FIG. 7A, as described above, with a short circuit between the gate and the source of the MOS transistor, the parasitic diode of the MOS transistor is used. In the level shift MOSes (MN1 and MN2), the MOS transistor is used as a MOS transistor.

Figure 10:
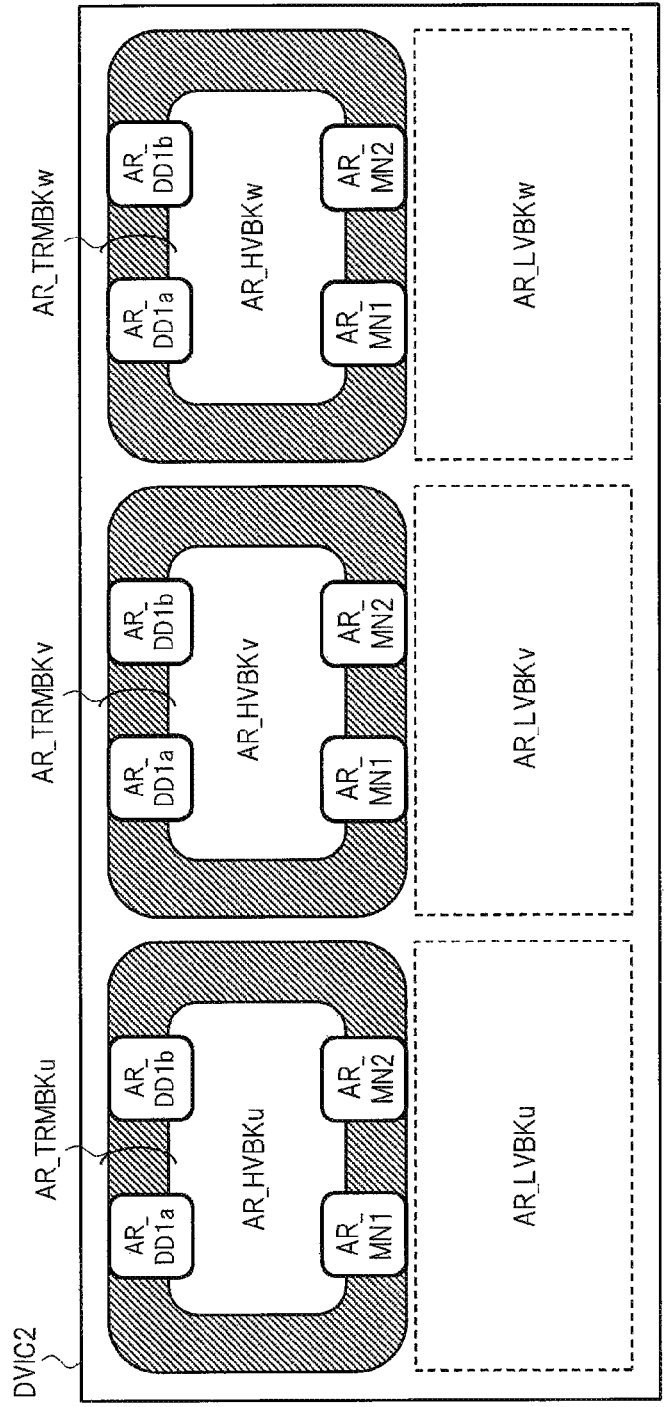
FIG. 10 is a plan view illustrating the configuration example of the layout expanded from FIG. 9.

FIG. 10 is a plan view of a configuration example of the layout expanded from FIG. 9. The driver IC (DVIC1) illustrated in FIG. 9 is configured such that the circuits for one phase (for example, u phase) in FIG. 4 are each built in a single semiconductor chip. However, as illustrated in FIG. 10, in the same manner, the circuits for the remaining two phases (v phase and w phase) can also be built in the same semiconductor chip. A semiconductor device (driver IC) DVIC2 illustrated in FIG. 10 is constituted by a single semiconductor chip, and in the semiconductor chip, termination regions AR_TRMBK (u, v, and w), low-voltage regions AR_LVBK (u, v, and w), and high-voltage regions AR_HVBK (u, v, and w) for three phases are formed.

<<Configuration of Power Module>>

Figure 11:
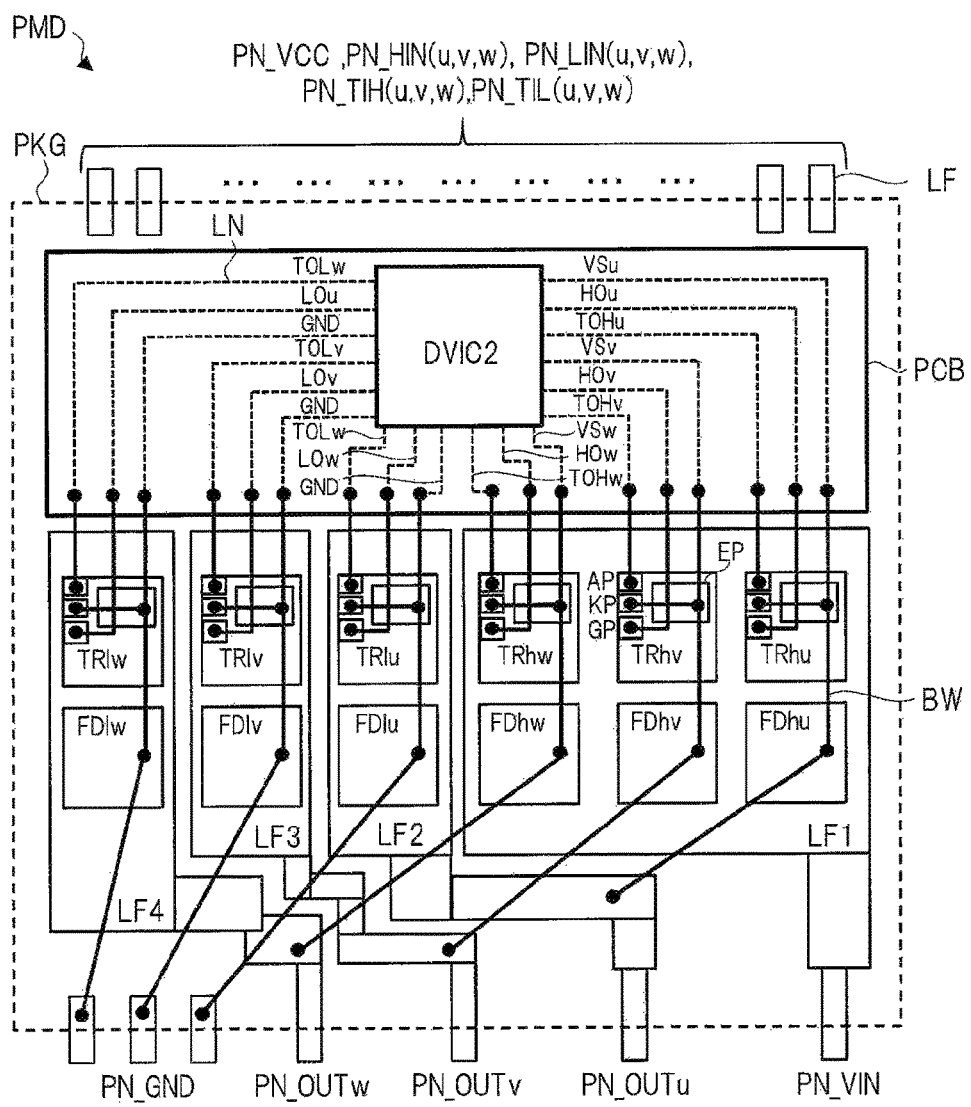
FIG. 11 is a plan view illustrating a schematic configuration example of a package in a power module according to the third embodiment of the present invention.

FIG. 11 is a plan view illustrating a schematic configuration example of a package in a power module according to the third embodiment of the present invention. A power module PMD illustrated in FIG. 11 is configured as a single package and is configured such that, for example, a wiring board PCB such as a glass epoxy substrate, lead frames LF1 to LF4, and a plurality of external leads LF as external terminals are sealed by a sealing material PKG such as epoxy resin.

On the wiring board PCB, the driver IC (semiconductor device) DVIC2 as illustrated in FIG. 10 is mounted. The plurality of external leads LF include the input power supply terminal PN_VIN, load drive terminals PN_OUT (u, v, and w) of three phases, and the reference power supply terminal PN_GND. In addition, the plurality of external leads LF include a power supply terminal PN_VCC, high-side signal terminals PN_HIN (u, v, and w) of three phases and low-side signal terminals PN_LIN (u, v, and w) of three phases, and high-side temperature terminals PN_TIH (u, v, and w) of three phases and low-side temperature terminals PN_TIL (u, v, and w) of three phases.

The power supply terminal PN_VCC is coupled to the pad PD (VCC) of FIG. 8. The high-side signal terminals PN_HIN (u, v, and w) are respectively coupled to the pads PD (HIN) of FIG. 8 provided for three phases, and the low-side signal terminals PN_LIN (u, v, and w) are respectively coupled to the pads PD (LIN) provided for three phases. The high-side temperature terminals PN_TIH (u, v, and w) are respectively coupled to the pads PD (TIH) of FIG. 8 provided for three phases and serve as terminals which communicate with the high-side switch HSW via the temperature detection circuit (coupling circuit) TCh. Similarly, the low-side temperature terminals PN_TIL (u, v, and w) are respectively coupled to the pads PD (TIL) provided for three phases and serve as terminals which communicate with the low-side switch LSW via the temperature detection circuit (coupling circuit) TCl.

The lead frame LF1 is integrated with the input power supply terminal PN_VIN and has three high-side transistors TRhu, TRhv, and TRhw and three freewheeling diodes FDhu, FDhv, and FDhw mounted thereon. The lead frame LF2 is integrated with a load drive terminal PN_OUTu and has a low-side transistor TRlu and a freewheeling diode FDlu mounted thereon. The lead frame LF3 is integrated with a load drive terminal PN_OUTv and has a low-side transistor TRlv and a freewheeling diode FDlv mounted thereon. The lead frame LF4 is integrated with a load drive terminal PN_OUTw and has a low-side transistor TRlw and a freewheeling diode FDlw mounted thereon.

The three high-side transistors TRhu, TRhv, and TRhw and the three low-side transistors TRlu, TRlv, and TRlw each have a vertical-type device structure as illustrated in FIG. 5 in which a mounted surface (that is, the back surface) for the lead frame serves as the collector electrode CP and the emitter electrode EP and the gate electrode GP are disposed on a front surface. Furthermore, on the front surface, the anode electrode AP and the cathode electrode KP of the temperature detection diode TD are also disposed. Still further, the six freewheeling diodes FDhu, FDhv, FDhw, FDlu, FDlv, and FDlw each have a vertical-type device structure in which the mounted surface (that is, the back surface) for the lead frame serves as a cathode electrode and an anode electrode is disposed on the front surface.

The emitter electrode EP and the cathode electrode KP disposed in the high-side transistor TRhu and the anode electrode of the freewheeling diode FDhu are coupled via a bonding wire BW to the load drive terminal PN_OUTu. Similarly, each of the electrodes (EP and KP) disposed in the high-side transistor TRhv and the anode electrode of the freewheeling diode FDhv are coupled to the load drive terminal PN_OUTv, and each of the electrodes (EP and KP) disposed in the high-side transistor TRhw and the anode electrode of the freewheeling diode FDhw are coupled to the load drive terminal PN_OUTw.

The emitter electrode EP and the cathode electrode KP disposed in the low-side transistor TRlu and the anode electrode of the freewheeling diode FDlu are coupled via a bonding wire BW to the reference power supply terminal PN_GND. Similarly, each of the electrodes (EP and KP) formed in the low-side transistor TRlv and the anode electrode of the freewheeling diode FDlv are coupled to the reference power supply terminal PN_GND, and each of the electrodes (EP and KP) formed in the low-side transistor TRlw and the anode electrode of the freewheeling diode FDlw are coupled to the reference power supply terminal PN_GND.

Three bonding wires BW coupled to the load drive terminals PN_OUTu, PN_OUTv, and PN_OUTw, respectively, are coupled to the wiring board PCB and are coupled to the driver IC (DVIC2) via three wires LN on the wiring board PCB, respectively. These three wires LN serve as wires for transmitting floating voltages VSu, VSv, and VSw, respectively. The bonding wires BW coupled to the reference power supply terminal PN_GND are coupled to the wiring board PCB and coupled to the driver IC (DVIC2) via wires LN on the wiring board PCB. These wires LN serve as wires for transmitting a reference voltage GND.

Three gate electrodes GP respectively disposed in the high-side transistors TRhu, TRhv, and TRhw are coupled to the wiring board PCB via three bonding wires BW and are respectively coupled to the driver IC (DVIC2) via three wires LN on the wiring board PCB. These three wires LN serve as wires for transmitting high-side switch signals HOu, HOv, and HOw, respectively. Three gate electrodes GP respectively disposed in the low-side transistors TRlu, TRlv, and TRlw are coupled to the wiring board PCB via three bonding wires BW and are respectively coupled to the driver IC (DVIC2) via three wires LN on the wiring board PCB. These three wires LN serve as wires for transmitting low-side switch signals LOu, LOv, and LOw.

Three anode electrodes AP respectively disposed in the high-side transistors TRhu, TRhv, and TRhw are coupled to the wiring board PCB via three bonding wires BW and are respectively coupled to the driver IC (DVIC2) via three wires LN on the wiring board PCB. These three wires LN serve as wires for transmitting temperature voltage signals TOHu, TOHv, and TOHw. Three anode electrodes AP respectively disposed in the low-side transistors TRlu, TRlv, and TRlw are coupled to the wiring board PCB via three bonding wires BW and are respectively coupled to the driver IC (DVIC2) via three wires LN on the wiring board PCB. These three wires LN serve as wires for transmitting temperature voltage signals TOLu, TOLv, and TOLw, respectively.

Main Effects of Third Embodiment

Figure 12:
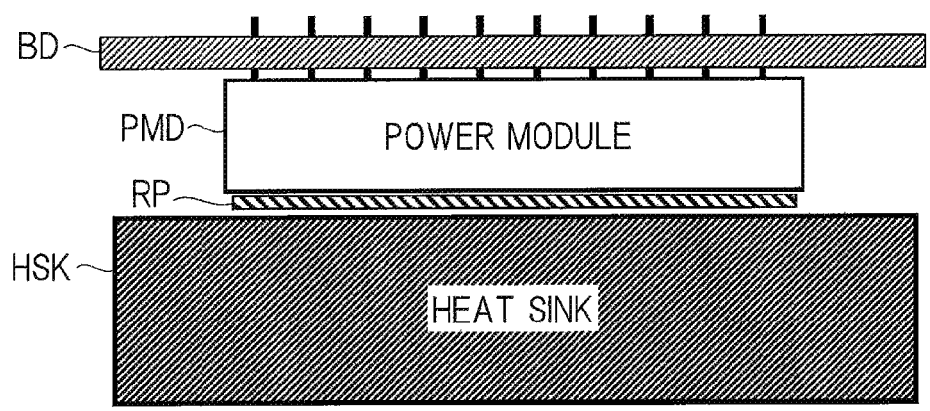
FIG. 12 is a schematic view illustrating an example of a mounted form of the power module of FIG. 11.

FIG. 12 is a schematic view illustrating an example of a mounted form of the power module of FIG. 11. As illustrated in FIG. 12, the power module PMD is mounted on, for example, the wiring board BD serving as a component of a power conversion system. On a surface opposed to a surface where the wiring board is to be mounted, a heat dissipation component such as a heat sink HSK is attached via resin paste RP. This mounting is performed by, for example, an assembly manufacturer.

Here, for example, when the scheme as illustrated in FIG. 16 is used, it is difficult to mount an insulating element such as the photocoupler CPL1' in the power module PMD. Therefore, the assembly manufacturer has to separately mount the temperature detection circuits TChu', TChv', and TChw' including these insulating elements in the wiring board BD. Moreover, when the scheme as illustrated in FIG. 17 is used, as described above, accuracy of the temperature detection circuits (TChu", TChv", and TChw") is low. In this case, in heat dissipation designing, the assembly manufacturer has to secure an excessive margin (derating) for compensating for this low accuracy. Specifically, for example, the characteristics of the heat sink HSK of FIG. 12 or the like has to be excessively designed.

In contrast, when the scheme of the third embodiment is used, as illustrated in FIG. 11 and the like, by mounting the inverter and each control circuit thereof in a single power module PMD, the number of mounting components in the wiring board BD can be reduced, compared with the case in which the transistors, circuits, and the like are each mounted in the wiring board BD as a separate component. In particular, the temperature detection circuits TChu', TChv', and TChw' including insulating elements as in FIG. 16 can be removed from the mounting components on the wiring board BD. In addition, with the level shift circuit LSC of FIG. 8, the insulating element corresponding to the photocoupler CPL10 can be removed. As a result, cost reduction, size reduction in the power conversion system, and the like can be achieved. Furthermore, the characteristics of the heat sink HSK or the like can be made appropriate. Also in this regard, cost reduction, size reduction in the power conversion system, and the like can be achieved.

Fourth Embodiment

Schematic Configuration of Power Conversion System (Application Example [2])

Figure 13:
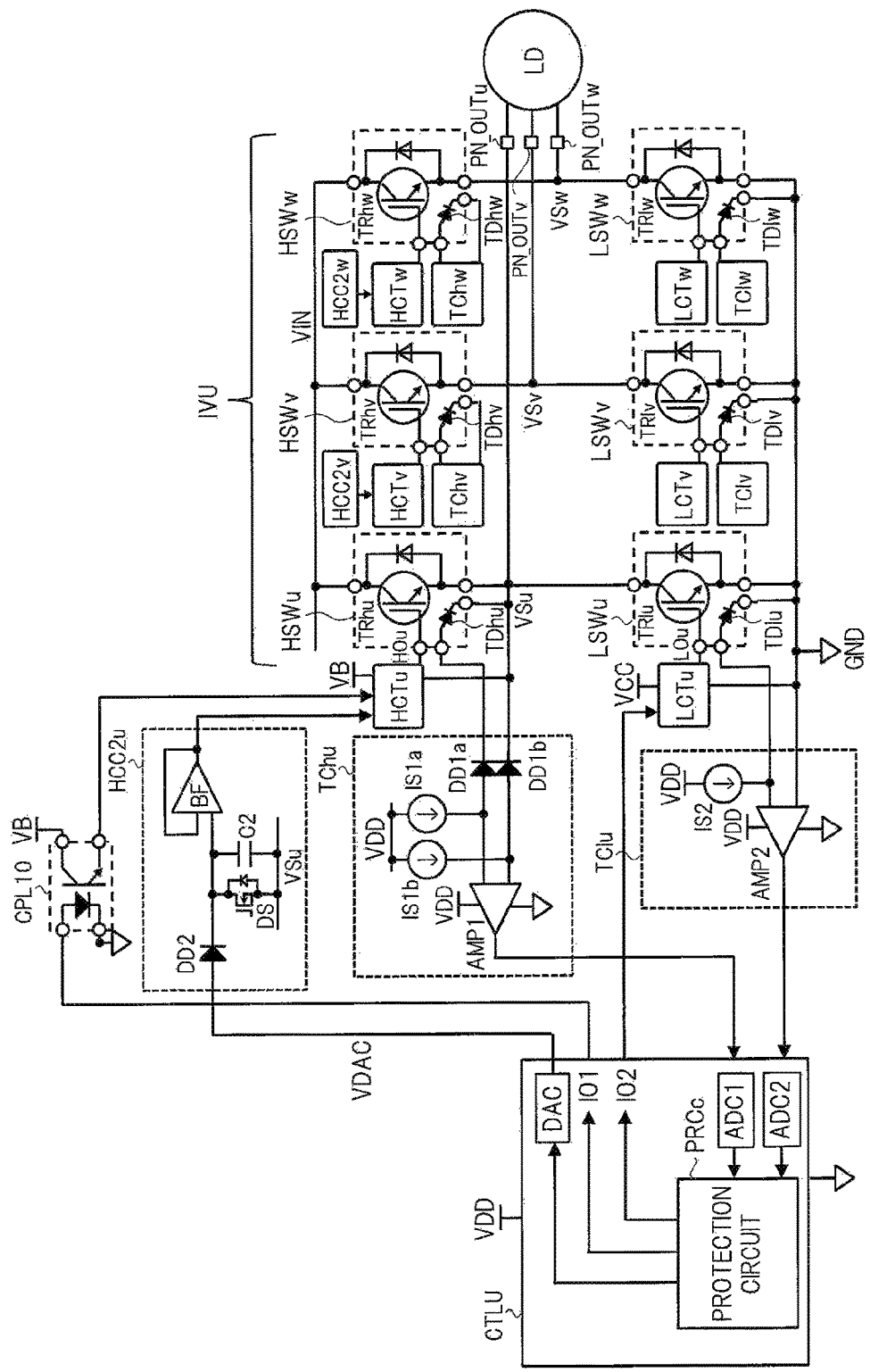
FIG. 13 is a circuit diagram illustrating a schematic configuration example of a main part in a power conversion system according to a fourth embodiment of the present invention.

FIG. 13 is a circuit diagram illustrating a schematic configuration example of a main part in a power conversion system according to a fourth embodiment of the present invention. The power conversion system illustrated in FIG. 13 has a configuration in which coupling circuits HCC2u, HCC2v, and HCC2w are added to the configuration example of FIG. 4. The coupling circuits HCC2u, HCC2v, and HCC2w correspond to the coupling circuit HCC2 illustrated in FIG. 1.

For example, the coupling circuit HCC2u includes, in addition to a diode DD2 and a pulldown switch DS similar to those of FIG. 1, a capacitor C2 and a buffer circuit BF. The pulldown switch DS is constituted by, for example, an NMOS transistor or the like, and although not illustrated in the drawings, as with the case of FIG. 1, ON/OFF of the pulldown switch DS is controlled by a high-side control circuit HCTu. The capacitor C2 is coupled between the cathode of the diode DD2 and a load drive terminal PN_OUTu (floating voltage VSu) in parallel to the pulldown switch DS. The buffer circuit BF is, for example, a voltage follower circuit which operates at the boot power supply voltage VB and the floating voltage VSu, with an input coupled to the cathode of the diode DD2 and an output coupled to the high-side control circuit HCTu.

The controller CTLU includes, for example, a digital-analog converter DAC, transmitting a signal VDAC from the digital-analog converter DAC to the anode of the diode DD2. The coupling circuits HCC2v and HCC2w each include a configuration similar to that of the coupling circuit HCC2u. Note that, when the driver IC described in the third embodiment is used, the diode DD2 is formed in the termination region AR_TRMBK of FIG. 9, and the pulldown switch DS, the capacitor C2, and the buffer circuit BF are formed in the high-voltage region AR_HVBK of FIG. 9.

For example, the high-side control circuit HCTu may include a circuit which variably controls the voltage of a high-side switch signal HOu at the "H" level. When this circuit is used, for example, by adjusting a slew rate of the high-side switch TRhu, noise reduction and the like can be achieved. Alternatively, as protecting operation in detecting temperature abnormality, instead of turning the high-side switch TRhu OFF as in FIG. 6 (in other words, stopping the system), the high-side switch TRhu is caused to perform operation in a state in which driving capability is reduced, thereby making it possible to return the temperature to a safety region. The coupling circuit HCC2u transmits any voltage signal from the controller CTLU for this circuit.

Schematic Operation of Power Conversion System (Application Example [2])

Figure 14:
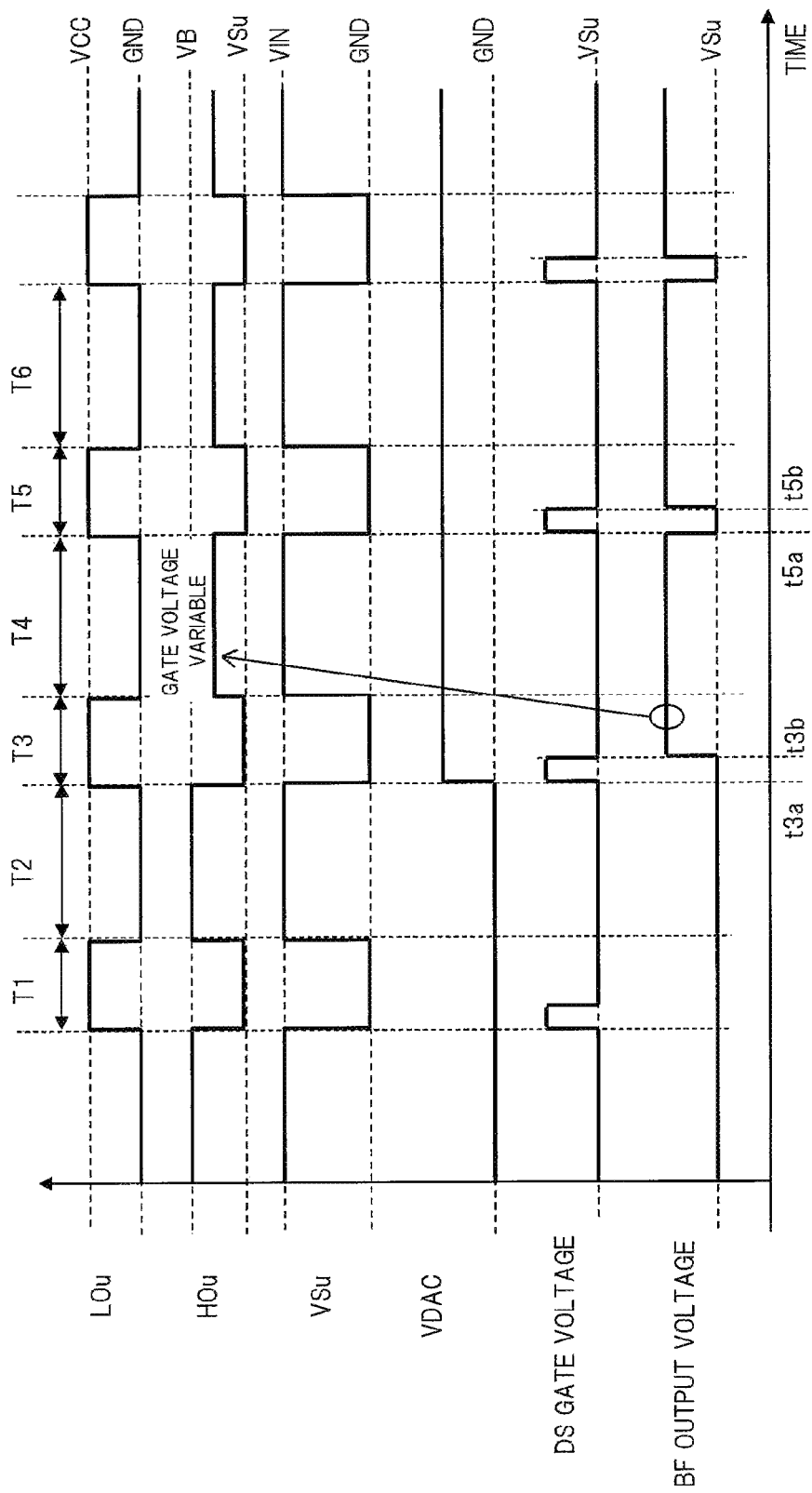
FIG. 14 is a waveform diagram illustrating a schematic operation example of the main part in the power conversion system of FIG. 13.

FIG. 14 is a waveform diagram illustrating a schematic operation example of the main part in the power conversion system of FIG. 13. Here, while operation for the u phase in FIG. 13 is described by way of example, the same goes for the v phase and the w phase. In FIG. 14, periods T1, T3, and T5 are the above-described low-side periods, and periods T2, T4, and T6 are the above-described high-side periods. In a PWM cycle of each of the periods T1 and T2, the voltage of the high-side switch signal HOu at the "H" level is the boot power supply voltage VB.

At a time t3a in the period T3, the controller CTLU transmits a signal VDAC having a predetermined voltage level. Meanwhile, the high-side control circuit HCTu controls the pulldown switch DS to be in an ON state in a period from the time t3a to a time t3b. Accordingly, an input voltage (and an output voltage) of the buffer circuit BF becomes the floating voltage VSu. When the pulldown switch DS is turned OFF at the time t3b, the capacitor C2 is charged with the voltage of the signal VDAC, and the input voltage (and the output voltage) of the buffer circuit BF also becomes the voltage of the signal VDAC.

When a transition is made from the period T3 to the period T4, the input voltage (and the output voltage) of the buffer circuit BF becomes a voltage obtained by adding the voltage of the signal VDAC to the floating voltage VSu (that is, the input power supply voltage VIN), and the diode DD2 becomes reverse-biased. In the period t4, although the signal VDAC from the controller CTLU is not transmitted to the buffer circuit BF, the voltage of the signal VDAC is kept by the capacitor C2 and is output from the buffer circuit BF. Based on the output voltage of the buffer circuit BF, the high-side control circuit HCTu variably controls the voltage of the high-side switch signal HOu at the "H" level between the floating voltage VSu and the boot power supply voltage VB.

Next, a transition is made from the period t4 to the period T5. As with the period between the times t3a and tab, the high-side control circuit HCTu controls the pulldown switch DS to be in an ON state in a period from a time t5a to a time t5b. Accordingly, the capacitor C2 is electrically discharged, and the input voltage (and the output voltage) of the buffer circuit BF becomes the floating voltage VSu. When the pulldown switch DS is turned OFF at the time t5b, the capacitor C2 is charged with the voltage of the signal VDAC, and similar operation is repeated thereafter.

Main Effects of Fourth Embodiment

As described above, by using the power conversion system of the fourth embodiment, as with the case of the first embodiment, communication between the controller CTLU and the high-side control circuits HCTu, HCTv, and HCTw can be performed at low cost. As a result, high functionality of the power conversion system can be easily achieved. Specifically, fine control from the controller CTLU to the high side can be made, typified by the above-described adjustment of the voltage level of the high-side switch signal. Here, various control can be performed mainly by software of the controller CTLU. Therefore, flexible control can be achieved at low cost.

Fifth Embodiment

<<Problems in Coupling Circuit>>

Figure 18A:
FIG. 18A is a waveform diagram illustrating an example of problems in a coupling circuit presumed in the power conversion system according to the fourth embodiment of the present invention.
Figure 18B:
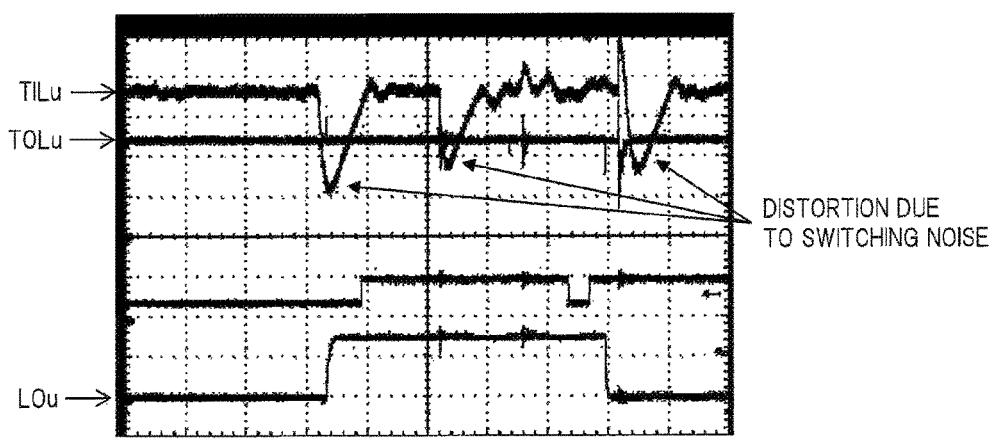
FIG. 18B is a waveform diagram illustrating the example of problems in the coupling circuit presumed in the power conversion system according to the fourth embodiment of the present invention.

FIG. 18A is a waveform diagram illustrating an example of problems in a coupling circuit presumed in the power conversion system according to the fourth embodiment of the present invention, and FIG. 18B is a waveform diagram illustrating the example of problems in the coupling circuit presumed in the power conversion system according to the fourth embodiment of the present invention. FIG. 18A illustrates actual operation waveforms of the temperature detection circuit TChu, by taking a case in which the temperature detection circuit TChu of FIG. 4 is applied to the coupling circuit HCC1 of FIG. 1 as an example. FIG. 18B illustrates actual operation waveforms of the temperature detection circuit TClu, by taking a case in which the temperature detection circuit TClu of FIG. 4 is applied to the coupling circuit LCC of FIG. 1 as an example.

As described with reference to FIG. 4, the temperature detection circuit TChu detects a differential voltage between the temperature voltage signal TOHu in accordance with the forward voltage of the temperature detection diode TDhu and the floating voltage VSu in the low-side period (period of the low-side switch signal LOu at the "H" level) and amplifies the differential voltage to output the temperature voltage signal TIHu. However, in actual operation, as illustrated in FIG. 18A, distortion may occur in the temperature voltage signal TIHu. This distortion is due to the fact that the forward voltage of the temperature detection diode TDhu is fluctuated by noise accompanied by switching of the high-side switch HSW and the low-side switch LSW (that is, switching noise).

In the example of FIG. 18A, distortion occurs at four points including rising and falling points of the low-side switch signal LOu and other two points. In this manner, distortion in the phase (here, the u phase) of the detection target may be caused not only by switching noise of each of the switches (HSWu and LSWu) corresponding to the phase (the u phase) of the detection target but also by switching noise of each of the switches (HSWv, LSWv, HSWw, and LSWw) corresponding to the other phases (the v phase and the w phase). Moreover, as illustrated in FIG. 18B, distortion may similarly occur also in the low-side temperature voltage signal TILu.

When distortion illustrated in FIG. 18A occurs, it may be difficult for the controller CTLU to detect a temperature with high accuracy. Moreover, a period in which a temperature can be detected may be greatly limited, and in some cases, that period may not be sufficiently obtained. That is, as described above, the period in which a high-side temperature can be detected is limited to any of low-side periods, and among these low-side periods, a period in which a temperature can be correctly detected is further limited due to distortion. Therefore, depending on the duty of the PWM signal, this period itself may not be sufficiently obtained.

Schematic Configuration of Power Conversion System (Application Example [3])

Figure 19:
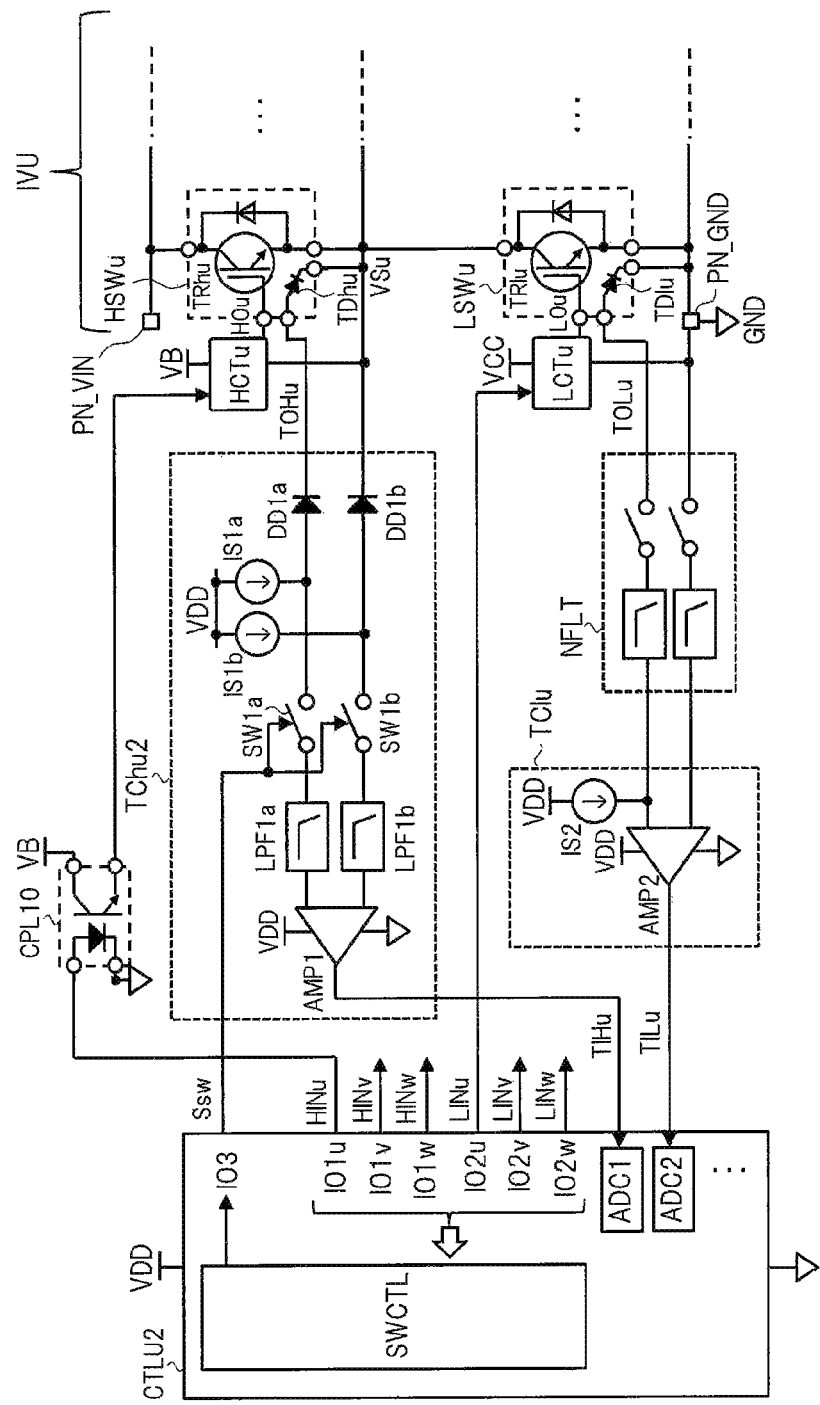
FIG. 19 is a circuit diagram illustrating a schematic configuration example of a main part in a power conversion system according to a fifth embodiment of the present invention.

FIG. 19 is a circuit diagram illustrating a schematic configuration example of a main part in a power conversion system according to a fifth embodiment of the present invention. The power conversion system illustrated in FIG. 19 is different, compared with the power conversion system illustrated in FIG. 4, in the configuration of a high-side temperature detection circuit TChu2 and the configuration of a controller CTLU2. In FIG. 19, for convenience, only the configuration of the inverter IVU of the u phase is illustrated. In practice, however, as with the case of FIG. 4, the configurations of the v phase and the w phase are provided. Also in FIG. 19, the high-side temperature detection circuit TChu2 of the u phase is illustrated. However, as with the case of FIG. 4, temperature detection circuits having a configuration similar to that of the temperature detection circuit of the u phase are provided to the high side of the v phase and the w phase.

The temperature detection circuit TChu2 is configured such that switches SW1a and SW1b and low-pass filters LPF1a and LPF1b are added to the temperature detection circuit TChu of FIG. 4. The switch SW1a and the low-pass filter LPF1a are sequentially inserted in series from a diode DD1a side into a wire between the diode DD1a and the differential amplifying circuit AMP1. The switch SW1b and the low-pass filter LPF1b are sequentially inserted in series from a diode DD1b side into a wire between the diode DD1b and the differential amplifying circuit AMP1.

As with the case of FIG. 4, the controller CTLU2 transmits a high-side switch control signal HINu serving as an ON/OFF signal for the high-side switch HSWu from an IO terminal IO1u and transmits a low-side switch control signal LINu serving as an ON/OFF signal for the low-side switch LSWu from an IO terminal IO2u. Also, although omitted in FIG. 19 for convenience, similarly for the v phase and the w phase, the controller CTLU2 transmits high-side switch control signals HINv and HINw from IO terminals IO1v and IO1w, respectively and transmits low-side switch control signals LINv and LINw from IO terminals IO2v and IO2w, respectively.

Furthermore, unlike the case of FIG. 4, the controller CTLU2 includes a switch control circuit SWCTL. The switch control circuit SWCTL generates a switch control signal Ssw based on each of switch control signals (HINu, HINv, HINw, LINu, LINv, and LINw) to transmit from an IO terminal IO3 to the switches SW1a and SW1b. ON/OFF of the switches SW1a and SW1b is controlled in accordance with the switch control signal Ssw.

The switches SW1a and SW1b are controlled to be in an OFF state in a predetermined period (for example, several μs) including a timing when ON/OFF of the high-side switches HSWu, HSWv, and HSWw and the low-side switches LSWu, LSWv, and LSWw is switched and is controlled to be in an ON state in a period other than the predetermined period. That is, the switches SW1a and SW1b are controlled to be in an OFF state in a period in which distortion caused by switching noise illustrated in FIG. 18 can occur. The switch control circuit SWCTL can obtain a timing of start of this period based on each of the switch control signals (HINu, HINv, HINw, LINu, LINv, and LINw).

Here, when the switches SW1a and SW1b are controlled to be in an OFF state, the input of the differential amplifying circuit AMP1 becomes open, and therefore, it is concerned that its input may become unsteady. Thus, here, the low-pass filter LPF1a is inserted into a wire between the switch SW1a and the differential amplifying circuit AMP1, and the low-pass filter LPF1b is inserted into a wire between the switch SW1b and the differential amplifying circuit AMP1. The low-pass filters LPF1a and LPF1b each include a capacitor coupled to the wire and the reference power supply voltage GND and therefore can hold a potential (in other words, a temperature) immediately before the switch is turned OFF for some period. Also, since a temperature change in a short period of several microseconds is extremely subtle (for example, 0.1° C. or lower), a difference between the temperature after this period and the temperature at the time of holding is ignorable.

Note that, in addition to a role of holding temperature information in an OFF period of the switches SW1a and SW1b, the low-pass filters LPF1a and LPF1b play a role of reducing noise occurring in the temperature voltage signal TOHu in an ON period of the switches SW1a and SW1b and also a role of reducing noise accompanied by ON/OFF of the switches SW1a and SW1b. Also, as a matter of course, the scheme of FIG. 19 can be applied not only to the temperature detection circuit TChu2 but also to the coupling circuit HCC1 of FIG. 1. In this case, it is useful to insert a switch (which is assumed to be SW1) into a wire between the diode DD1 and the controller CTLU in the same manner. Furthermore, it is also useful to insert a low-pass filter (which is assumed to LPF1) into a wire between the switch (SW1) and the controller CTLU.

Operation of Temperature Detection Circuit (Application Example [3])

Figure 20:
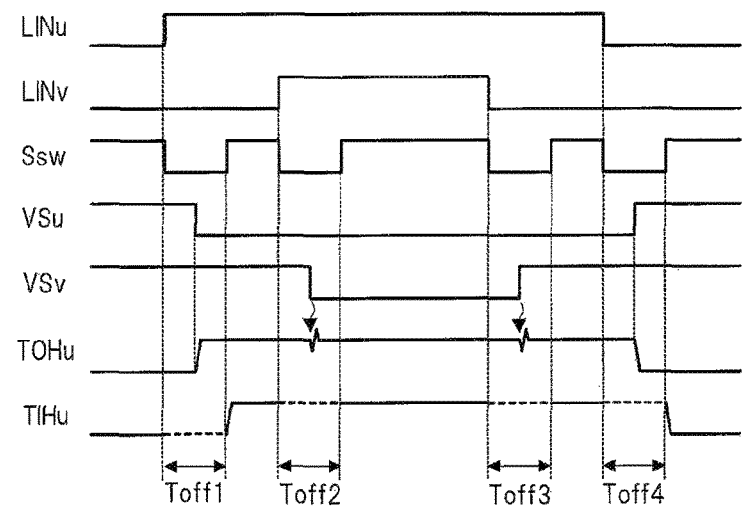
FIG. 20 is a schematic diagram illustrating an example of operation timings of a temperature detection circuit of FIG. 19.

FIG. 20 is a schematic diagram illustrating an example of operation timings of a temperature detection circuit of FIG. 19. Here, by way of example, the low-side switch control signals LINu and LINv of the u phase and the v phase are described, but similar operation is performed also on the other switch control signals (LINw, HINu, HINv, and HINw). In the example of FIG. 20, rising/falling edges of the low-side switch control signals LINu and LINv occur four times in total, and accordingly, an "L" period of the switch control signal Ssw also occurs four times. These four periods are OFF periods Toff1 to Toff4 of the switches SW1a and SW1b.

In these OFF periods Toff1 to Toff4, the low-side switches LSWu and LSWv are switched, and the floating voltages VSu and VSv of the u phase and the v phase change. According to this change, switching noise is superposed on the temperature voltage signal TOHu. However, since the switches SW1a and SW1b are in an OFF state, the temperature voltage signal TIHu is not influenced. Note that the off periods Toff1 to Toff4 may each have any length as long as the length includes a period in which the floating voltages VSu, VSv, and VSw of the u phase, the v phase, and the w phase change, and normally, the same length (for example, 3 μs) can be set.

<<Configuration of Switch Control Circuit>>

Figure 21:
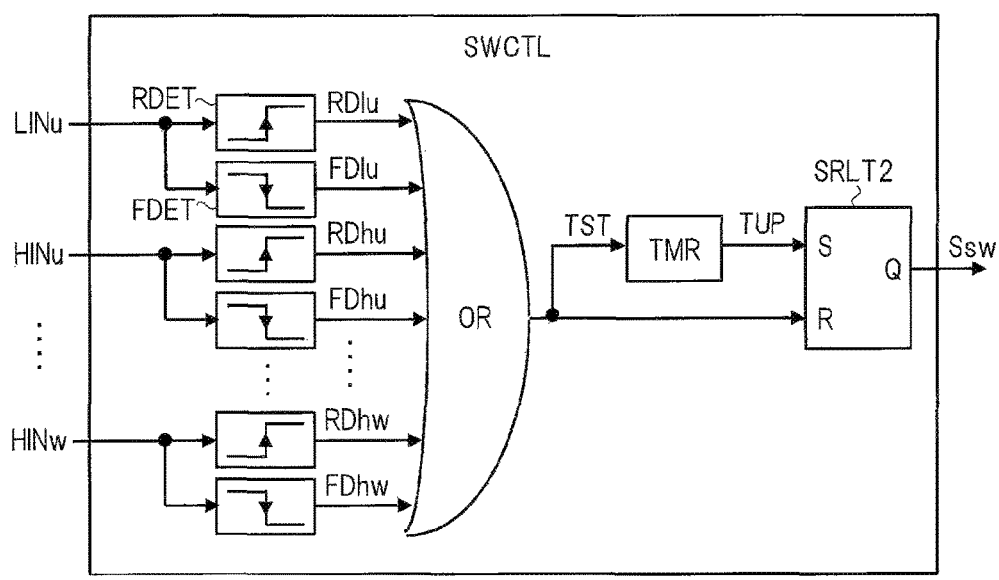
FIG. 21 is a schematic diagram illustrating a configuration example of a switch control circuit of FIG. 19.

FIG. 21 is a schematic diagram illustrating a configuration example of the switch control circuit of FIG. 19. For example, when the controller CTLU2 is a microcontroller (MCU) or the like, by program processing by a CPU (Central Processing Unit), for example, a switch control circuit SWCTL equivalent to that of FIG. 21 is constructed. The switch control circuit SWCTL of FIG. 21 includes six pairs (here, only three pairs of these are exemplarily illustrated) of a rising detection circuit RDET and a falling detection circuit FDET, an OR arithmetic circuit OR, a timer circuit TMR, and an SR latch circuit SRLT2.

The rising detection circuit RDET and the falling detection circuit FDET are provided to each of the switch control signals of the u phase, the v phase, and the w phase (LINu, HINu, LINv, HINv, LINw, and HINw). For example, the rising detection circuit RDET corresponding to the low-side switch control signal LINu generates a rising detection signal RDlu at the time of occurrence of an "H" transition of the low-side switch control signal LINu. Also, the falling detection circuit FDET corresponding to the low-side switch control signal LINu generates a falling detection signal FDlu at the time of occurrence of an "L" transition of the low-side switch control signal LINu.

Similarly, the rising detection circuits RDET corresponding to the other switch control signals (HINu, LINv, HINv, LINw, and HINw) generate rising detection signals RDhu, RDlv, RDhv, RDlw, and RDhw, respectively, each in accordance with an "H" transition of the corresponding switch control signal. The falling detection circuits FDET corresponding to the other switch control signals (HINu, LINv, HINv, LINw, and HINw) generate falling detection signals FDhu, FDlv, FDhv, FDlw, and FDhw, respectively, each in accordance with an "L" transition of the corresponding switch control signal.

The OR arithmetic circuit OR outputs a timer start signal TST based on the OR arithmetic operation result of each of the detection signals (RDlu, FDlu, RDhu, FDhu, RDhw, and FDhw). The timer circuit TMR starts counting for a predetermined period (for example, several microseconds) corresponding to each of the OFF periods Toff1 to Toff4 of FIG. 20 in response to the timer start signal TST and outputs a time-up signal TUP when the counting period ends. Here, when a timer start signal TST is received during counting, the timer circuit TMR starts counting again. The SR latch circuit SRLT2 causes the switch control signal Ssw to make a transition to the "L" level in response to the timer start signal TST and to make a transition to the "H" level in response to the time-up signal TUP.

As described above, by using the power conversion system of the fifth embodiment, in addition to the various effects described in the second embodiment, influences of switching noise can be effectively eliminated with less circuit overhead. As a result, high accuracy of temperature detection can be achieved. Also, by the capacitor of the low-pass filter, the period in which temperature detection can be performed can be sufficiently secured.

Note that the above-described configurations of the switches SW1a and SW1b and the low-pass filters LPF1a and LPF1b are effective also for low-side communication. Since the low side is not floating, insulation by a high-withstand-voltage diode is not required. However, as illustrated in FIG. 18B, in view of noise, noise caused by the switching element is superposed, as with the case of the high side. Therefore, as illustrated in FIG. 19, by providing a noise filter NFLT including a switch and a low-pass filter also to the low side, influences of switching noise can be effectively eliminated.

In the foregoing, the invention made by the inventors of the present invention has been concretely described based on the embodiments. However, the present invention is not limited to the foregoing embodiments, and various modifications and alterations can be made within the scope of the present invention. For example, the embodiments are described in detail to simplify the explanation of the present invention. Thus, it is not always necessary to provide all the described configurations. Moreover, the configurations of one of the embodiments may be partially replaced with those of the other embodiment or the configurations of one of the embodiments may further include the configurations of the other embodiment. Alternatively, the configurations of the embodiments may partially allow the addition of other configurations, deletion, and replacement.

For example, in the second and fourth embodiments, as application examples of the scheme of FIG. 1, high-side temperature detection and adjustment of the voltage level of the high-side switch signal are performed. It goes without saying that the present invention is not limited to these. Similarly, for example, detection of excessive voltage and excessive current on the high side and various control on the high side in accordance thereto can also be performed. Also, while an inverter in a three-phase-bridge configuration is taken as an example in the second and fourth embodiments, it goes without saying that the present invention is similarly applicable also to an inverter in a full-bridge configuration or half-bride configuration. However, as the number of switches increases, more useful effects can be obtained.

What is claimed is:

1. A power conversion system comprising:
a high-side circuit and a low-side circuit;
a controller communicating with the high-side circuit and the low-side circuit;
a first coupling circuit including a wire between the controller and the high-side circuit; and
a second coupling circuit including a wire between the controller and the low-side circuit,
wherein the high-side circuit includes:
a high-side switch coupled between a first power supply terminal to which a first power supply voltage is supplied using a reference power supply voltage as a reference and a load drive terminal, the high-side switch supplying power to a load via the load drive terminal; and
a high-side driver driving the high-side switch,
wherein the low-side circuit includes:
a low-side switch coupled between a reference power supply terminal to which the reference power supply voltage is supplied and the load drive terminal, the low-side switch supplying power to the load via the load drive terminal; and
a low-side driver driving the low-side switch,
wherein the first coupling circuit includes a diode having an anode coupled to the wire from the controller and a cathode coupled to the wire from the high-side circuit,
wherein the high-side circuit includes a first temperature detection diode formed in a semiconductor chip where the high-side switch is formed, the first temperature detection diode detecting a temperature of the high-side switch and having a cathode coupled to the load drive terminal, and
wherein the first coupling circuit includes:
a first diode having a cathode coupled to an anode of the first temperature detection diode;
a second diode having a cathode coupled to the cathode of the first temperature detection diode;
a first current source to which a second power supply voltage lower than the first power supply voltage is supplied, the first current source flowing a forward current to the first temperature detection diode via the first diode;
a second current source to which the second power supply voltage is supplied, the second current source flowing a forward current to the second diode; and
a first differential amplifying circuit detecting a differential voltage between an anode of the first diode and an anode of the second diode and transmitting the detection result to the controller.

2. The power conversion system according to claim 1, wherein the first differential amplifying circuit detects the forward voltage of the first temperature detection diode via the first diode and the second diode in a period in which the high-side switch is in an OFF state and the low-side switch is in an ON state.

3. The power conversion system according to claim 1, wherein the diode transmits a signal from the controller to the high-side circuit in a period in which the high-side switch is in an OFF state and the low-side switch is in an ON state.

4. The power conversion system according to claim 1, wherein the diode transmits a signal from the high-side circuit to the controller in a period in which the high-side switch is in an OFF state and the low-side switch is in an ON state.

5. The power conversion system according to claim 2,
wherein the low-side circuit includes a second temperature detection diode formed in a semiconductor chip where the low-side switch is formed, the second temperature detection diode detecting a temperature of the low-side switch and having a cathode coupled to the reference power supply terminal, and
wherein the second coupling circuit includes:
a third current source flowing a forward current to the second temperature detection diode; and
a second differential amplifying circuit detecting a differential voltage between an anode and the cathode of the second temperature detection diode and transmitting the detection result to the controller.

6. The power conversion system according to claim 3, wherein the first coupling circuit includes a pulldown switch coupled between the cathode of the diode and the load drive terminal.

7. The power conversion system according to claim 3, further comprising:
an insulating element converting a voltage level of an output signal of the controller into a voltage level of an input signal of the high-side circuit,
wherein the insulating element transmits an ON/OFF signal of the high-side switch transmitted from the controller to the high-side circuit.

8. The power conversion system according to claim 4, wherein the first coupling circuit includes a current source supplied with a second power supply voltage lower than the first power supply voltage and flowing a forward current to the diode.

9. A power module configured as a single package, the power module comprising:
a first power supply terminal to which a first power supply voltage is supplied using a reference power supply voltage as a reference;
a reference power supply terminal to which the reference power supply voltage is supplied;
a load drive terminal;
a high-side circuit and a low-side circuit;
a first terminal transmitting or receiving a signal to or from the high-side circuit;
a second terminal transmitting or receiving a signal to or from the low-side circuit;
a first coupling circuit including a wire between the first terminal and the high-side circuit; and
a second coupling circuit including a wire between the second terminal and the low-side circuit,
wherein the high-side circuit includes:
a high-side transistor coupled between the first power supply terminal and the load drive terminal, the high-side transistor supplying power to a load via the load drive terminal; and
a high-side driver driving the high-side transistor,
wherein the low-side circuit includes:
a low-side transistor coupled between the reference power supply terminal and the load drive terminal, the low-side transistor supplying power to the load via the load drive terminal; and
a low-side driver driving the low-side transistor,
wherein the first coupling circuit includes a diode having an anode coupled to the wire from the first terminal and a cathode coupled to the wire from the high-side circuit,
wherein the high-side transistor is formed in a first semiconductor chip,
wherein the low-side transistor is formed in a second semiconductor chip, and
wherein the high-side driver, the low-side driver, and the diode are formed in a third semiconductor chip.

10. The power module according to claim 9,
wherein, in the first semiconductor chip, a first temperature detection diode detecting a temperature of the high-side transistor and having a cathode coupled to the load drive terminal is formed, and
wherein, in the third semiconductor chip:
a first diode having a cathode coupled to an anode of the first temperature detection diode is formed,
a second diode having a cathode coupled to the cathode of the first temperature detection diode is formed,
a first current source flowing a forward current to the first temperature detection diode via the first diode is formed,
a second current source flowing a forward current to the second diode is formed, and
a first differential amplifying circuit detecting a differential voltage between an anode of the first diode and an anode of the second diode and transmitting the detection result to the first terminal is formed.

11. The power module according to claim 9, wherein the diode transmits a signal received at the first terminal to the high-side circuit in a period in which the high-side transistor is in an OFF state and the low-side transistor is in an ON state.

12. The power module according to claim 10,
wherein, in the second semiconductor chip, a second temperature detection diode detecting a temperature of the low-side transistor and having a cathode coupled to the reference power supply terminal is formed, and
wherein, in the third semiconductor chip,
a third current source flowing a forward current to the second temperature detection diode is formed, and
a second differential amplifying circuit detecting a differential voltage between an anode and the cathode of the second temperature detection diode and transmitting the detection result to the second terminal is formed.

13. The power module according to claim 11, wherein, in the third semiconductor chip, a pulldown transistor coupled between the cathode of the diode and the load drive terminal is formed.

14. A semiconductor device constituted by a single semiconductor chip, the semiconductor device comprising:
a load drive terminal coupled to a floating voltage;
a reference power supply terminal to which a reference power supply voltage is supplied;
a first temperature detection terminal coupled to a first temperature detection diode provided outside the semiconductor device;
a termination region in a ring shape;
a first region provided inside the termination region, the first region in which a circuit operating at a first power supply voltage using the floating voltage as a reference is formed;
a second region provided outside the termination region, the second region in which a circuit operating at a second power supply voltage using the reference power supply voltage as a reference is formed;
a high-side driver formed in the first region, the high-side driver driving a high-side transistor provided outside the semiconductor device;
a low-side driver formed in the second region, the low-side driver driving a low-side transistor provided outside the semiconductor device;
a first diode formed in the termination region, the first diode having a cathode coupled to the first temperature detection terminal; and
a first current source formed in the second region, the first current source coupled to an anode of the first diode.

15. The semiconductor device according to claim 14, further comprising:
a second diode formed in the termination region, the second diode having a cathode coupled to the load drive terminal;
a second current source formed in the second region, the second current source coupled to an anode of the second diode; and
a first differential amplifying circuit formed in the second region, the first differential amplifying circuit detecting a differential voltage between the anode of the first diode and the anode of the second diode.

16. The semiconductor device according to claim 14, further comprising:
   a level shift circuit including a transistor formed in the termination region and converting a signal using the reference power supply voltage as a reference into a signal using the floating voltage as a reference to output to the high-side driver.

17. The semiconductor device according to claim 15, further comprising:
   a second temperature detection terminal coupled to a second temperature detection diode provided outside the semiconductor device;
   a second current source formed in the second region, the second current source coupled to the second temperature detection terminal; and
   a second differential amplifying circuit detecting a differential voltage between the second temperature detection terminal and the reference power supply terminal.

18. The semiconductor device according to claim 16, wherein the first diode comprises a parasitic diode of the transistor.

* * * * *